(12) United States Patent
Guo et al.

(10) Patent No.: US 11,972,820 B2
(45) Date of Patent: Apr. 30, 2024

(54) NON-VOLATILE MEMORY WITH TIER-WISE RAMP DOWN AFTER PROGRAM-VERIFY

(71) Applicant: SanDisk Technologies LLC, Addison, TX (US)

(72) Inventors: Jiacen Guo, Sunnyvale, CA (US); Dengtao Zhao, Los Gatos, CA (US); Xiang Yang, Santa Clara, CA (US)

(73) Assignee: SanDisk Technologies LLC, Austin, TX (US)

( * ) Notice: Subject to any disclaimer, the term of this patent is extended or adjusted under 35 U.S.C. 154(b) by 142 days.

(21) Appl. No.: 17/898,850

(22) Filed: Aug. 30, 2022

(65) Prior Publication Data

US 2024/0071529 A1 Feb. 29, 2024

(51) Int. Cl.
*G11C 16/34* (2006.01)
*G11C 16/04* (2006.01)
*G11C 16/08* (2006.01)
*G11C 16/10* (2006.01)

(52) U.S. Cl.
CPC ...... *G11C 16/3459* (2013.01); *G11C 16/0433* (2013.01); *G11C 16/08* (2013.01); *G11C 16/102* (2013.01)

(58) Field of Classification Search
CPC . G11C 16/3459; G11C 16/0433; G11C 16/08; G11C 16/102
See application file for complete search history.

(56) References Cited

U.S. PATENT DOCUMENTS

| | | | |
|---|---|---|---|
| 8,909,493 B2 | 12/2014 | Avila et al. | |
| 9,466,369 B1 | 10/2016 | Pang et al. | |
| 9,620,233 B1 | 4/2017 | Dong et al. | |
| 10,157,680 B2 | 12/2018 | Yang et al. | |
| 10,276,248 B1 | 4/2019 | Lu et al. | |
| 10,283,202 B1 | 5/2019 | Chen et al. | |
| 10,541,037 B2 | 1/2020 | Zhao et al. | |
| 10,726,920 B2 * | 7/2020 | Yang .................. | G11C 16/0466 |

(Continued)

OTHER PUBLICATIONS

U.S. Appl. No. 17/724,769, filed Apr. 20, 2022.
(Continued)

*Primary Examiner* — Joshua L Schwartz
(74) *Attorney, Agent, or Firm* — Vierra Magen Marcus LLP

(57) ABSTRACT

Memory cells are arranged as NAND strings to form a block divided into sub-blocks, and each NAND string includes a dummy memory cell connected to a dummy word line. Memory cells are programmed by applying programming pulses to a selected word line in a selected sub-block with program-verify performed between pulses. Unselected NAND strings are inhibited from programming by boosting channels of the unselected NAND strings in the selected sub-block from a positive pre-charge voltage to a boosted voltage. The pre-charging of the channels of unselected NAND strings is performed while lowering voltages at the end of program-verify by applying overdrive voltages to data word lines in a sub-block closer to the source line than the selected sub-block and lowering to a resting voltage a dummy word line between the sub-blocks prior to lowering to a resting voltage the data word lines in the sub-block closer to the source line.

20 Claims, 28 Drawing Sheets

(56) References Cited

U.S. PATENT DOCUMENTS

| | | |
|---|---|---|
| 2006/0168491 A1 | 7/2006 | Lee et al. |
| 2007/0258276 A1 | 11/2007 | Higashitani |
| 2008/0159002 A1 | 7/2008 | Dong et al. |
| 2008/0279007 A1 | 11/2008 | Dong et al. |
| 2009/0180320 A1* | 7/2009 | Torii .................. G11C 16/10 365/185.05 |
| 2014/0108705 A1 | 4/2014 | Gorobets |
| 2020/0321055 A1 | 10/2020 | Yang |
| 2021/0174885 A1 | 6/2021 | Jia et al. |

OTHER PUBLICATIONS

U.S. Appl. No. 17/527,747, filed Nov. 16, 2021.
U.S. Appl. No. 17/872,148, filed Jul. 25, 2022.
U.S. Appl. No. 17/884,929, filed Aug. 10, 2022.

* cited by examiner

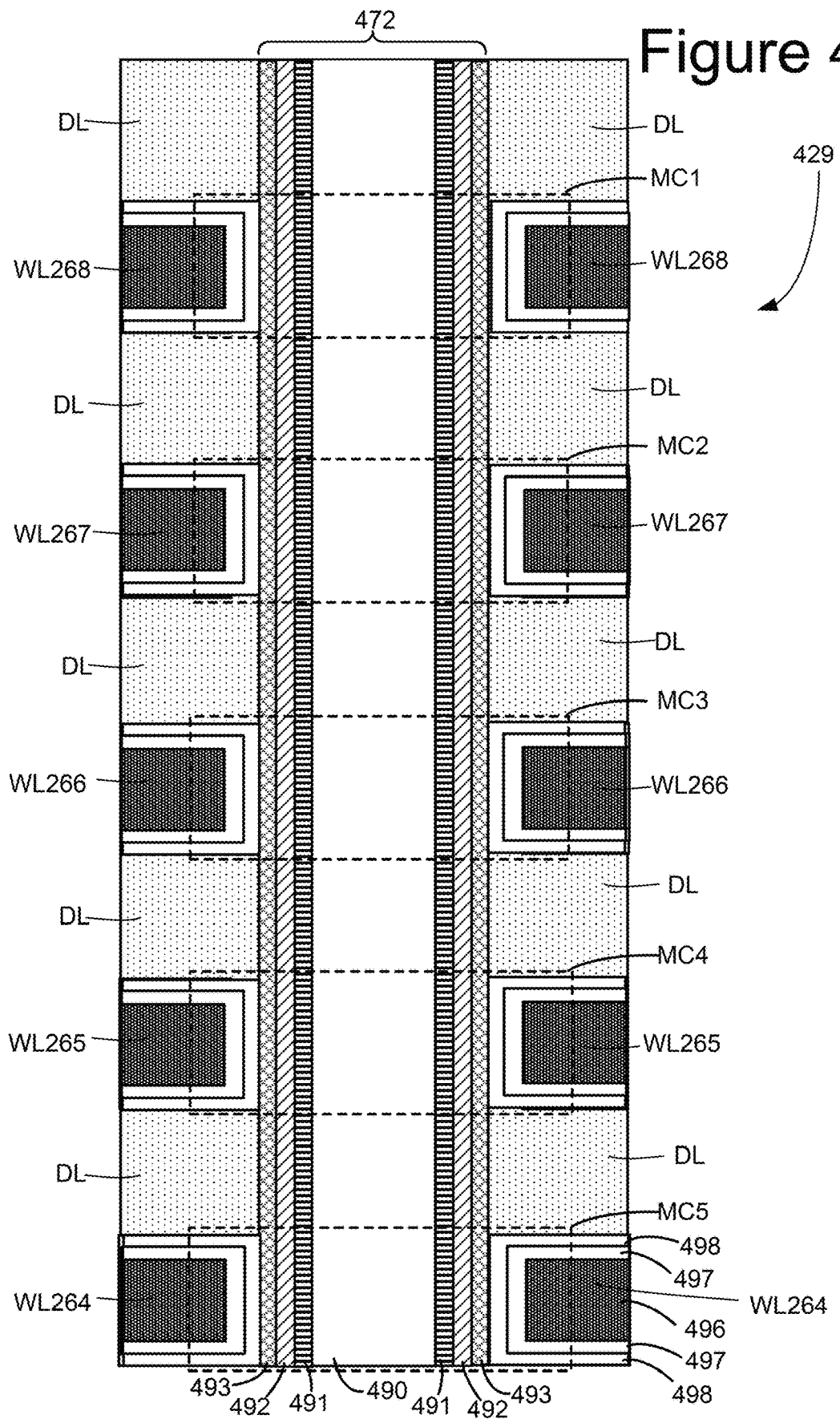

NON-VOLATILE MEMORY WITH TIER-WISE RAMP DOWN AFTER PROGRAM-VERIFY

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Users of non-volatile memory can program (i.e., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 4F is a cross sectional view of one embodiment of a vertical column of memory cells.

DETAILED DESCRIPTION

Figure 1:
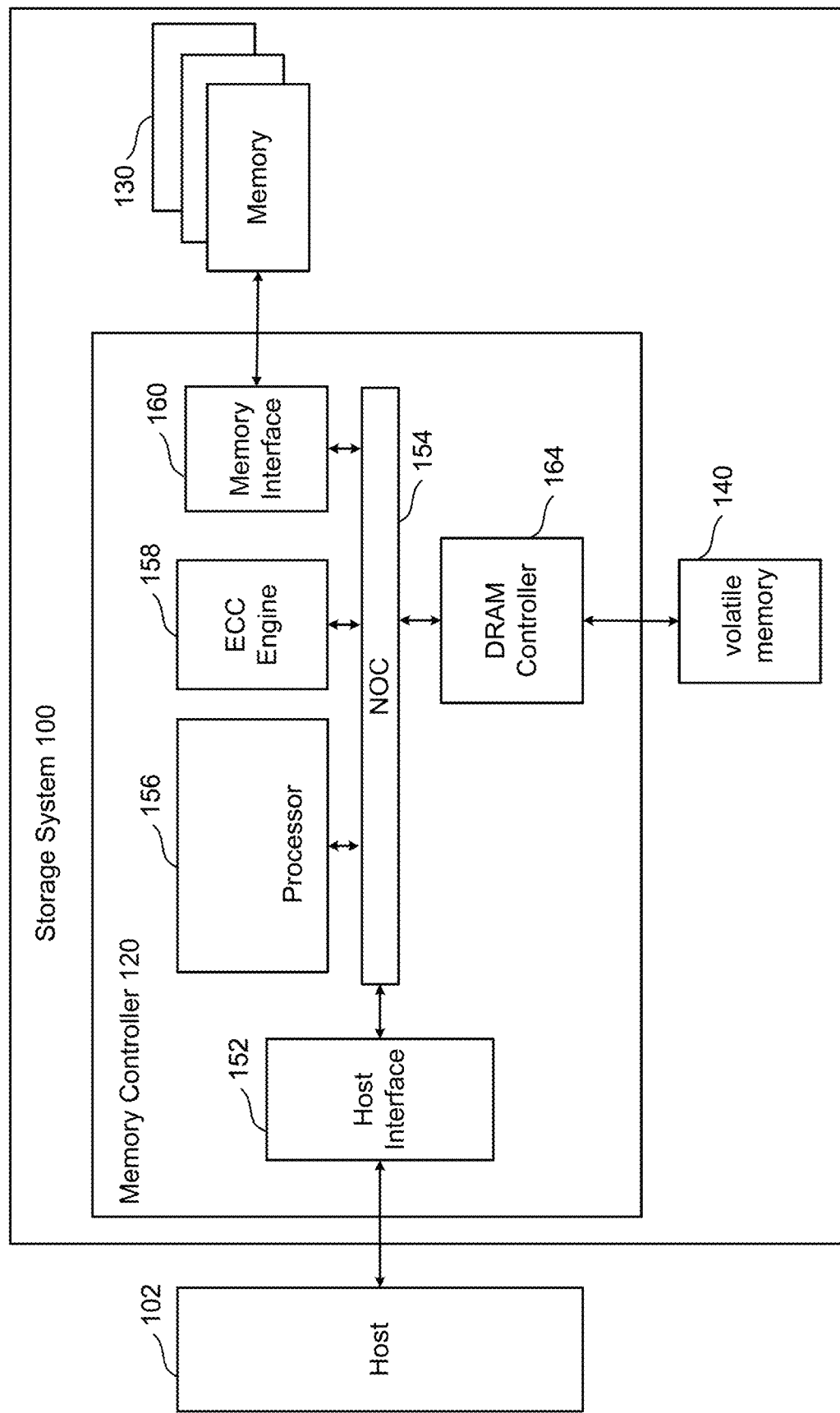
FIG. 1 is a block diagram depicting one embodiment of a storage system.

Some systems program memory cells by applying doses of programming to a selected word line that is connected to memory cells selected for programming (selected memory cells). Between the doses of programming, program-verify is performed to determine whether the programming was successful. Because a selected word line can be connected to selected memory cells and unselected memory cells (i.e. memory cells that are not supposed to be programmed), the system takes measures to avoid a disturb (e.g., unwanted programming) of unselected memory cells, including pre-charging and boosting the voltage of channels of unselected memory cells to prevent a disturb. The pre-charging is typically performed after program-verify and before the next dose of programming. The boosting is performed after the pre-charging. In some memories, under certain conditions, some portions of the memory do not have access to a source of pre-charging. Without proper pre-charging, the boosting of channels of unselected memory cells may not be successful in preventing a disturb.

To overcome the above-described issue, it is proposed that the pre-charging of channels of unselected memory cells be accomplished while lowering voltages at the end of program-verify. The proposed scheme for pre-charging can be used with a memory system that perform operations for sub-blocks. For example, memory cells of a block are divided into sub-blocks. Selected memory cells of a selected sub-block that are connected to a selected data word line are programmed by applying the above-described doses of programming to the selected data word line with program-verify performed between the doses. Unselected memory cells of the selected sub-block that are connected to the selected data word line are inhibited from programming by boosting channels of those unselected memory cells connected to the selected data word line from a positive pre-charge voltage to a boosted voltage. The channels of the unselected memory cells connected to the selected data word line are pre-charged to the pre-charge voltage while lowering voltages at the end of program-verify by applying an overdrive voltage to data word lines between the selected word line and one or more control lines (e.g., one or more source lines) concurrently with applying a pre-charging voltage to the one or more control lines to provide the channels of the unselected memory cells with access to the pre-charging voltage on the one or more control lines while lowering voltages of data word lines further from the one or more control lines than the selected word line. The channels of the unselected memory cells are cut off from the one or more control lines subsequent to the pre-charging and prior to lowering the data word lines between the selected word line and the one or more control lines from the overdrive voltage to one or more voltages below threshold voltages of memory cells connected to the data word lines between the selected word line and the one or more control lines.

FIG. 1 is a block diagram of one embodiment of a non-volatile storage system 100 that implements the proposed technology described herein. In one embodiment, non-volatile storage system 100 is a solid state drive ("SSD"). Non-volatile storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
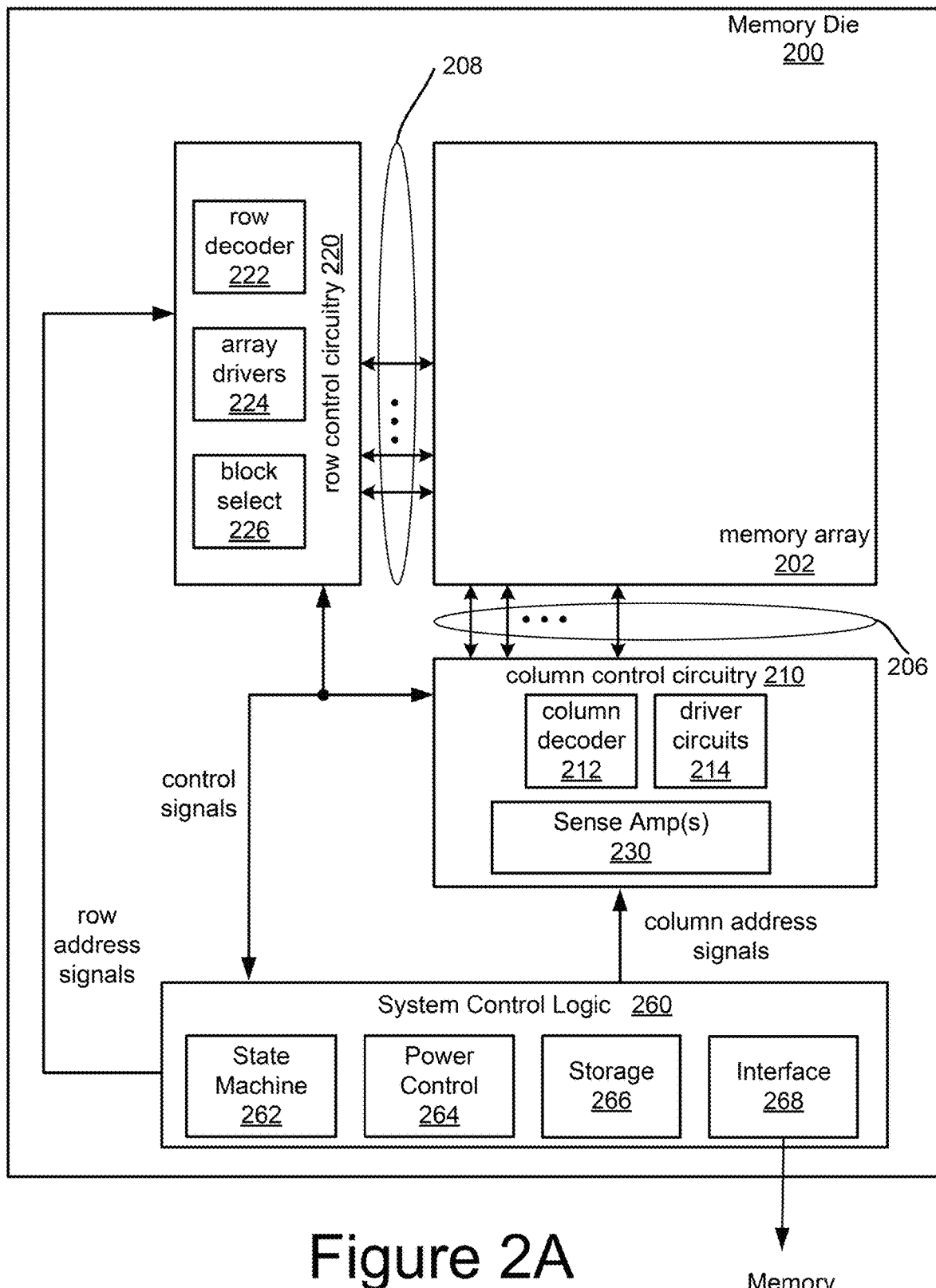
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below.

The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ CMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
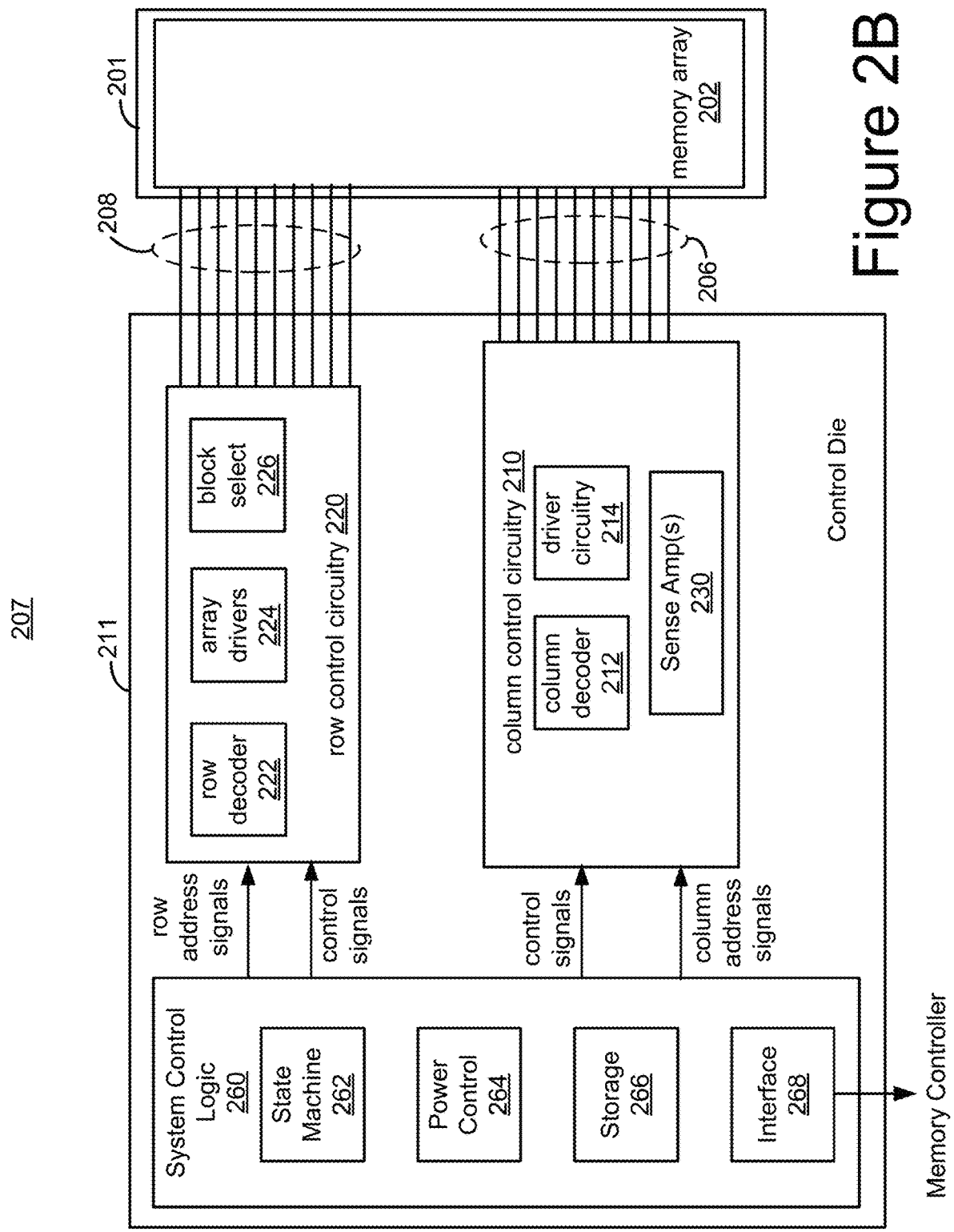
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212 and driver circuitry 214, and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
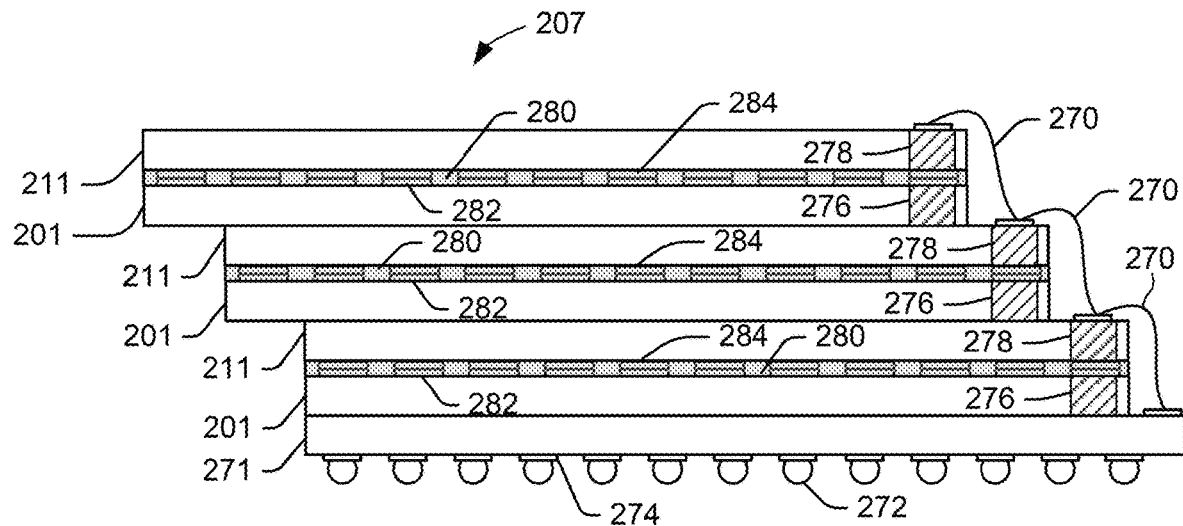
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
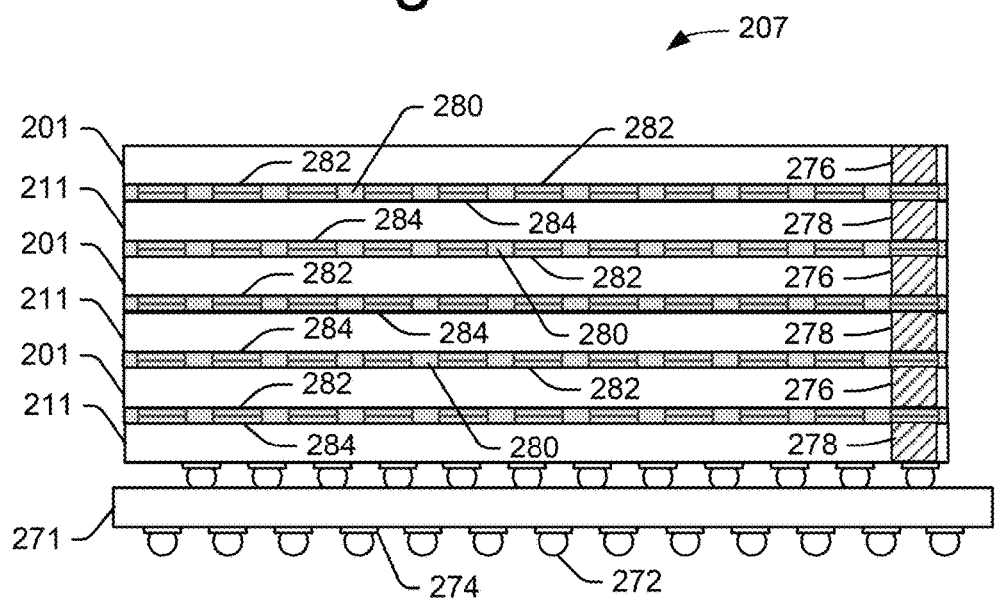

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
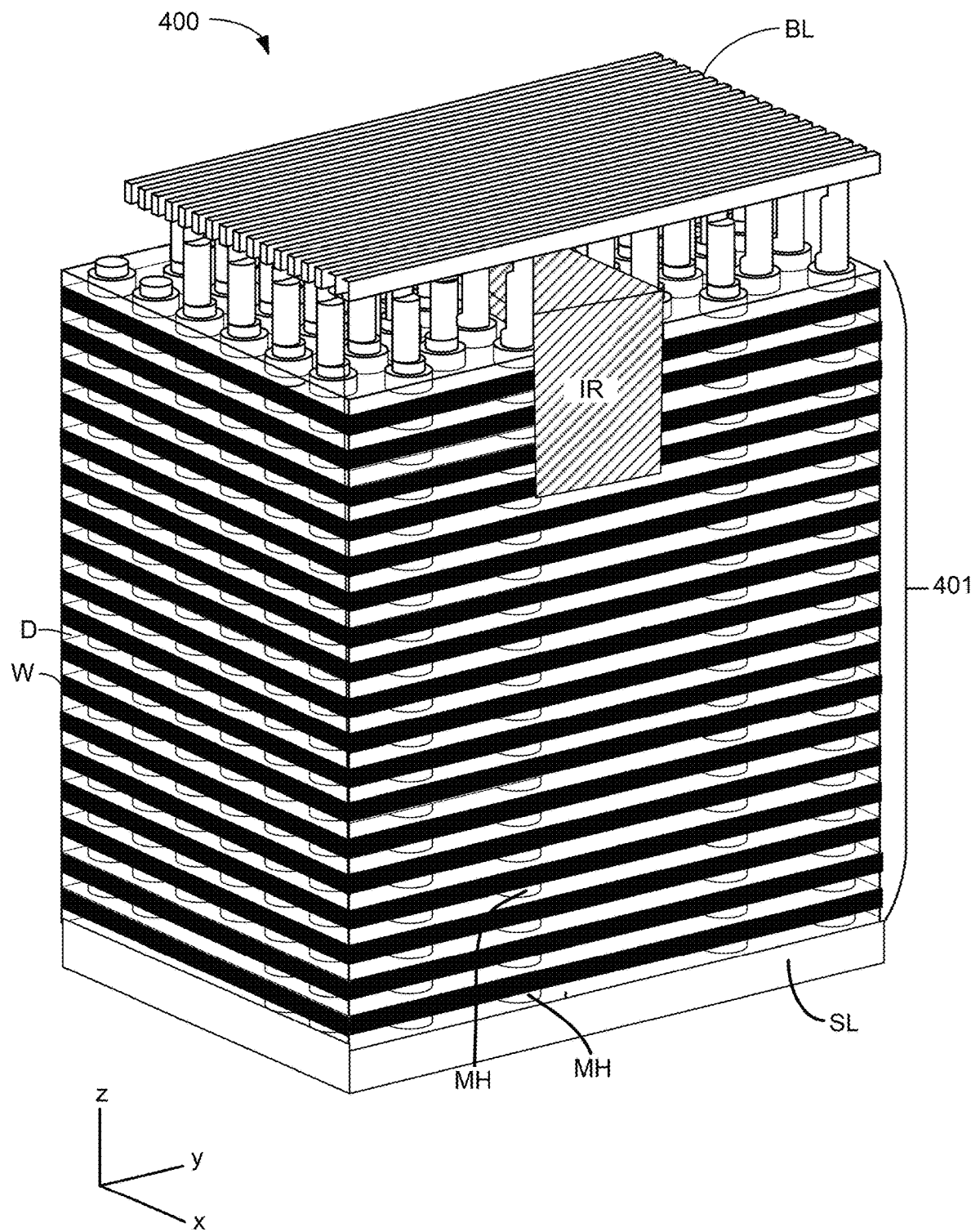
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions by isolation regions IR. These regions are sometimes referred to as fingers or strings. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
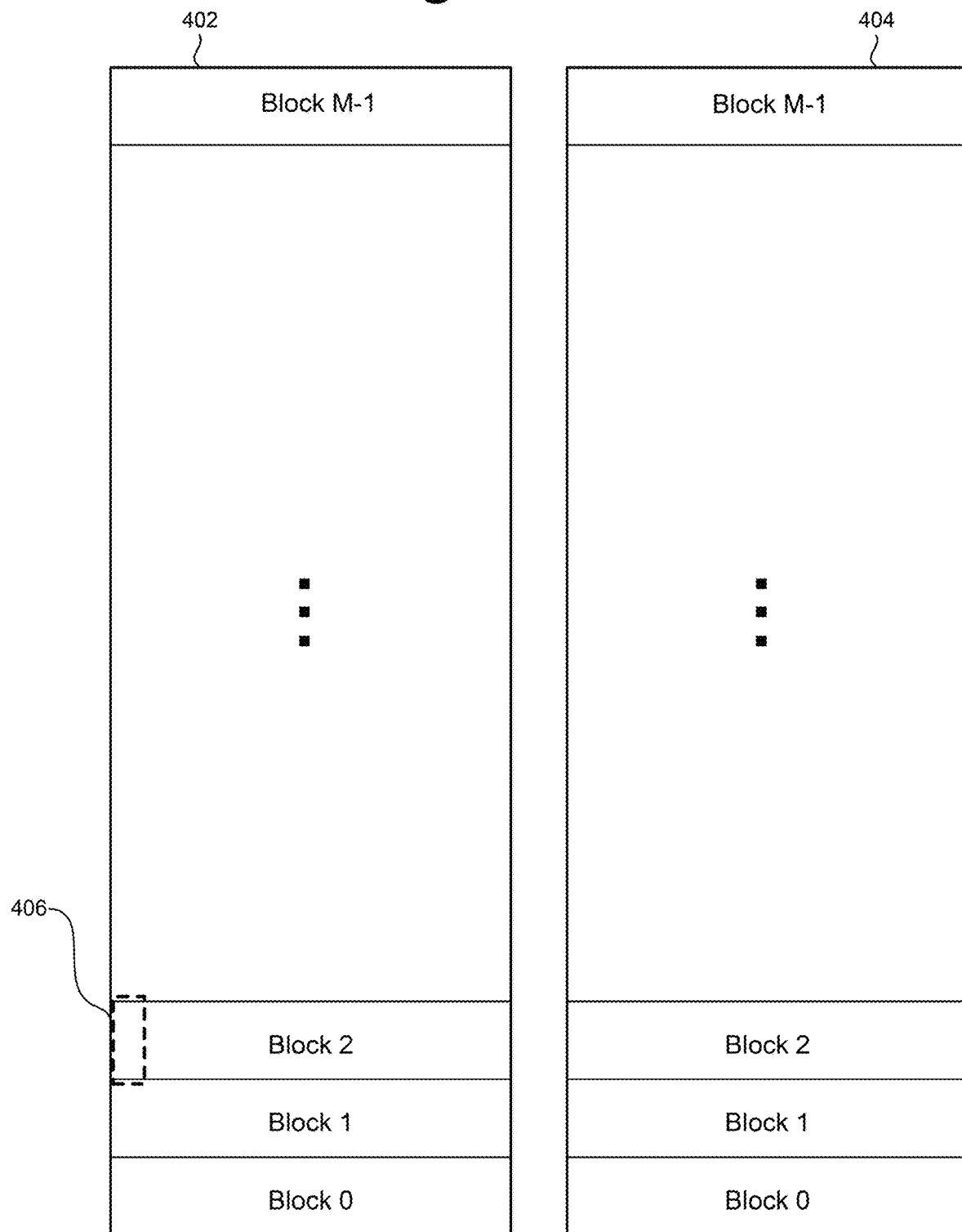
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes four planes, eight planes or more than eight planes.

Figure 4B:
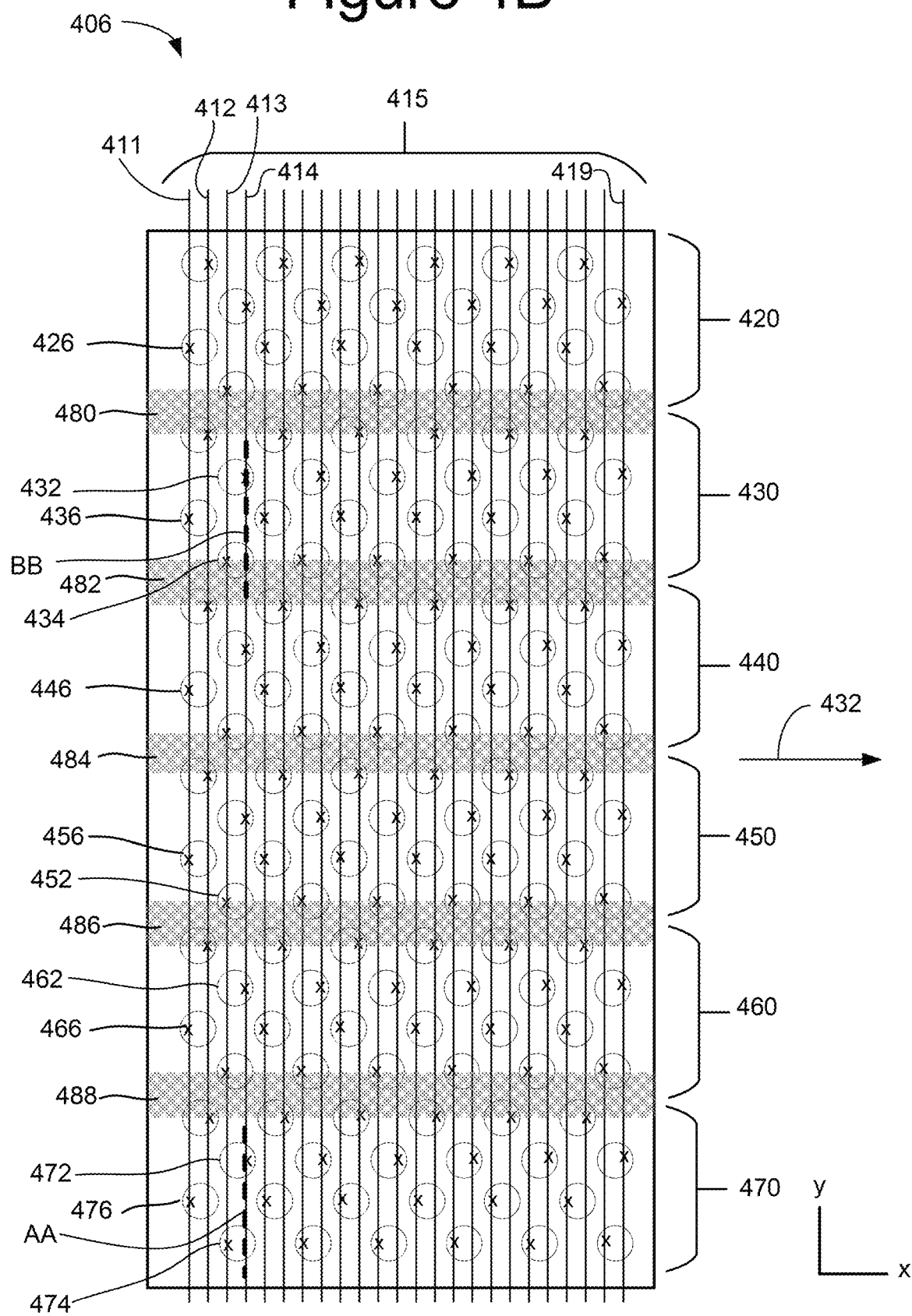
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446. 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470. In one embodiment, the isolation regions only divide the layers used to implement select gates (e.g., SGD) so that NAND strings in different regions can be independently selected. In one example implementation, a bit line only connects to one vertical column/NAND string in each of regions 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines (SGD) to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
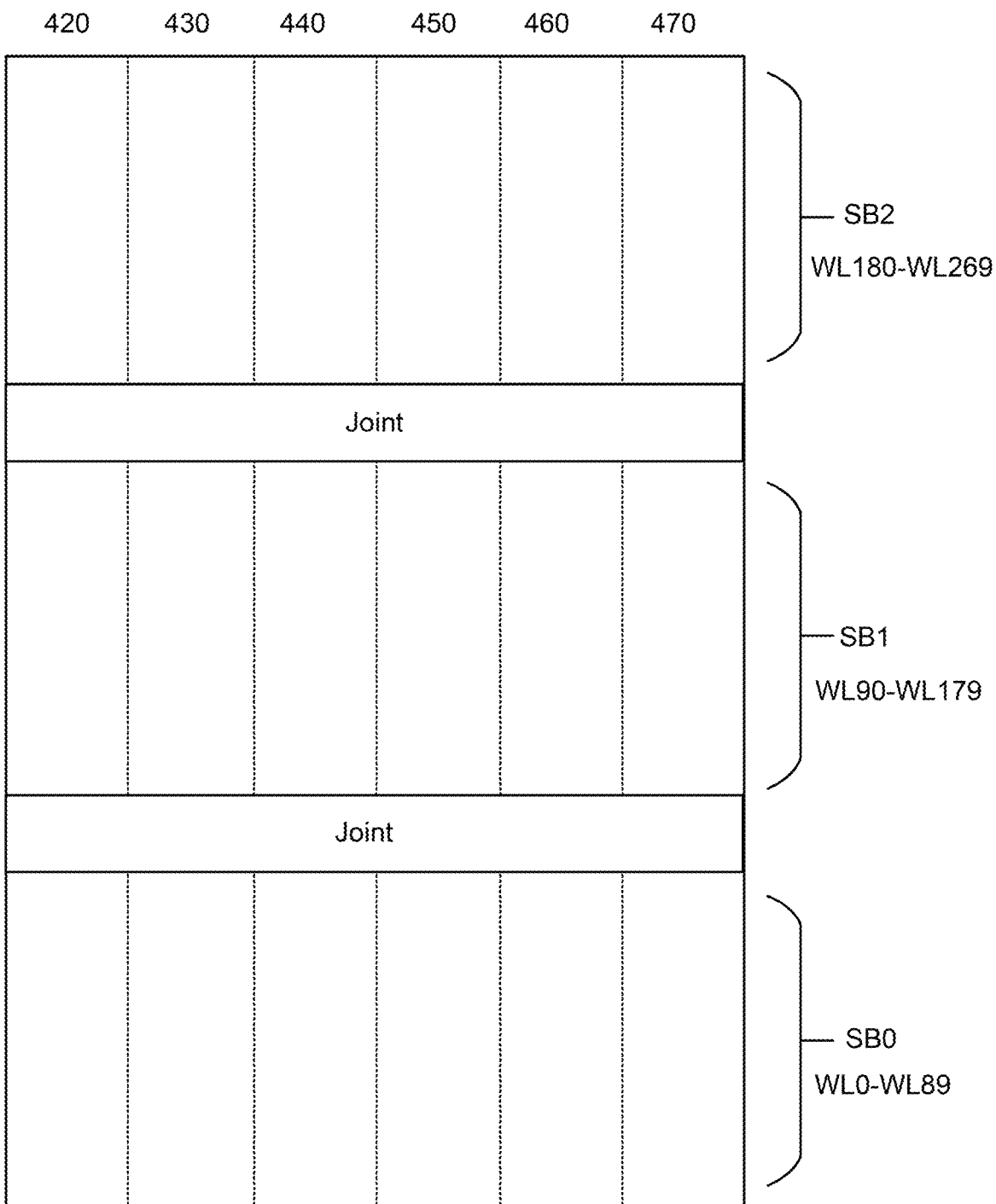
FIG. 4C depicts a cross sectional view of a portion of one embodiment of a block of memory cells.

FIG. 4C depicts a side view of portion 406 of Block 2 of plane 402, that is also depicted in FIG. 4B. The side view of FIG. 4C shows that the memory array is implemented as a three tier architecture, with each tier separate by a Joint area. In one embodiment, a block is divided into sub-blocks such that each tier is a separate sub-block. For example, in the three tier architecture of FIG. 4C, the block is divided into three sub-blocks. The first sub-block, sub-block 0 (SB0), is the bottom sub-block. The second sub-block, sub-block 1 (SB1), is the middle sub-block. The third sub-block, sub-block 2 (SB2), is the top sub-block. In an example embodiment that includes 270 word lines, SB0 comprises word lines WL0-WL89, SB1 comprises word lines WL90-WL179 and SB2 comprises WL180-WL269. In other embodiments, a block has more than three tiers and/or a block is divided into more than three sub-blocks.

Figure 4D:
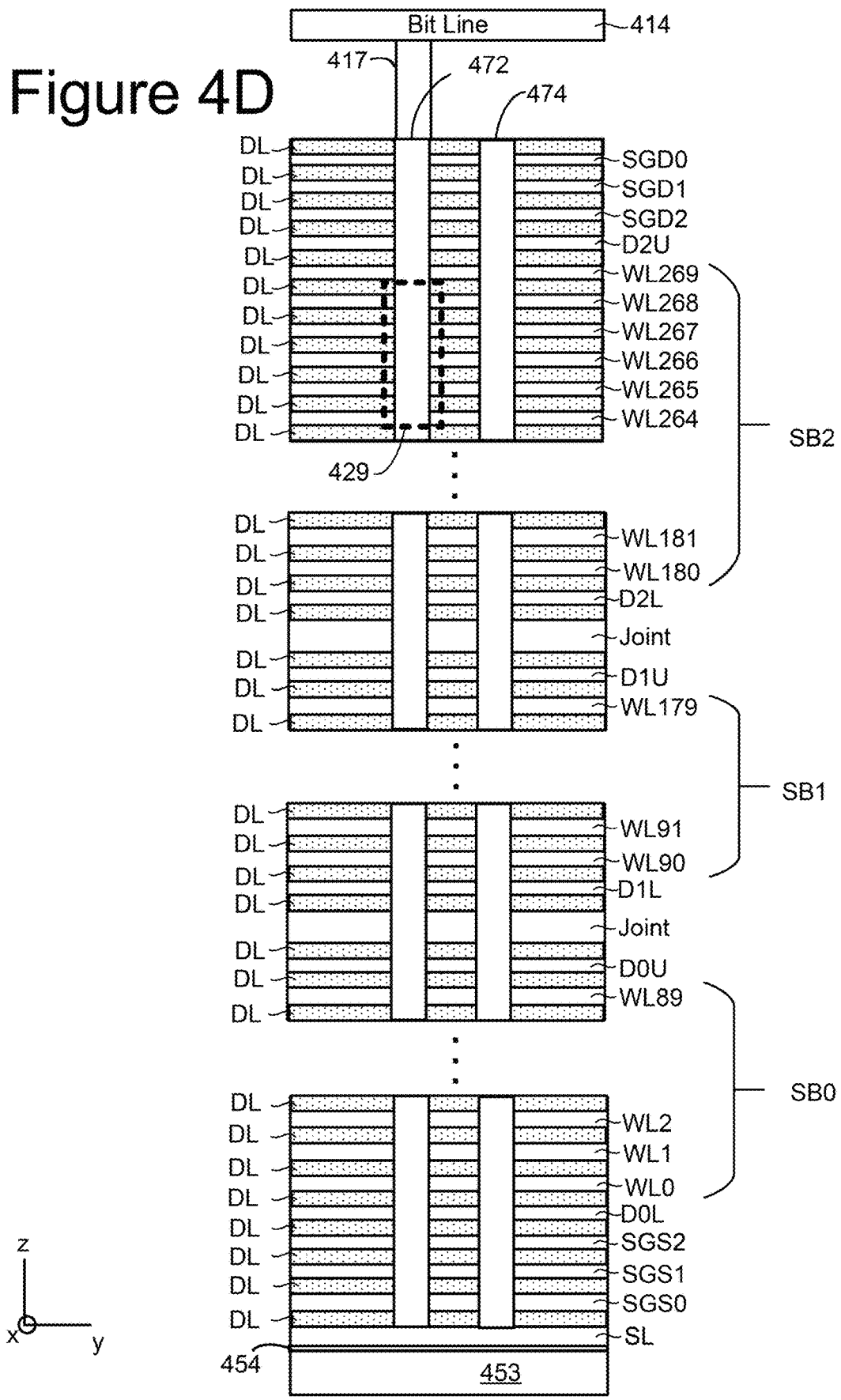
FIG. 4D depicts a cross sectional view of a portion of one embodiment of a block of memory cells.

FIG. 4D depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4D includes three drain side select layers SGD0, SGD1 and SGD2 (that form select lines); three source side select layers SGS0, SGS1, and SGS2 (that form select lines); dummy word line layers D0L, D0U, D1L, D1I, D2L and D2U for connecting to dummy memory cells (that do not store data from a host); two hundred and seventy data word line layers WL0-WL269 for connecting to data memory cells (that store data), and dielectric layers DL. Other embodiments can implement more or less than the numbers described above for FIG. 4D. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 472 has a source end at a bottom of the stack and a drain end at a top of the stack. As in agreement with FIG. 4B, FIG. 4D shows vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings to form a block having three sub-blocks SB0, SB1 and SB2. The word line layers WL0-W269 connect to memory cells (also called data memory cells). Each NAND string of the block includes memory cells in each of the three sub-bocks; for example, memory cells connected to word lines WL0-WL89 are in SB0, memory cells connected to word lines WL90-WL179 are in SB1, memory cells connected to word lines WL180-WL269 are in SB2. Dummy word line layers connect to dummy memory cells. A dummy memory cell does not store and is not eligible to store host data (data provided from the host or entity outside of the storage system 100), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

FIG. 4D also shows two Joint areas. In one embodiment it is expensive and/or challenging to etch so many word line layers intermixed with dielectric layers. To ease this burden, one embodiment includes laying down a first stack of word line layers alternating with dielectric layers (e.g., for SB0), laying down the lower Joint area, laying down a second stack of word line layers alternating with dielectric layers (e.g., for SB1), laying down the upper Joint area, and laying down a third stack of word line layers alternating with dielectric layers (e.g., for SB2). The Joint areas re positioned between the first stack and the second stack, AND between the second stack and the third stack. In one embodiment, the Joint areas are made from the same materials as the word line layers.

In one set of embodiments, the data word lines are divided into three sets of data word lines: a first plurality of data word lines (e.g., WL0-WL89) are connected to non-volatile memory cells of the first sub-block SB0 without being connected to non-volatile memory cells of the other sub-block SB1 & SB2; a second plurality of data word lines (e.g., WL90-WL179) are connected to non-volatile memory cells of the second sub-block SB1 without being connected to non-volatile memory cells of the other sub-blocks SB0 & SB2; and a third plurality of data word lines (e.g., WL180-WL269) are connected to non-volatile memory cells of the second sub-block SB2 without being connected to non-volatile memory cells of the other sub-blocks SB0 & SB1. In these embodiments, dummy word lines D0U and D1L are closer to the source line SL than the second plurality of data word lines (e.g., WL90-WL179) and the third plurality of data word lines (e.g., WL180-WL269). Dummy word line D0U (and the dummy memory cells connected to D0U) are on a first side of the joint area and dummy word line D1L (and the dummy memory cells connected to D1L) are on a second side of the joint area. Dummy word lines D0U and D1L are positioned between the first plurality of data word lines (e.g., WL0-WL89) and the second plurality of data word lines (e.g., WL90-WL179). The dummy memory cells connected to dummy word lines D0U and D1L are positioned between the first sub-block SB0 and the second sub-block SB1.

Figure 4E:
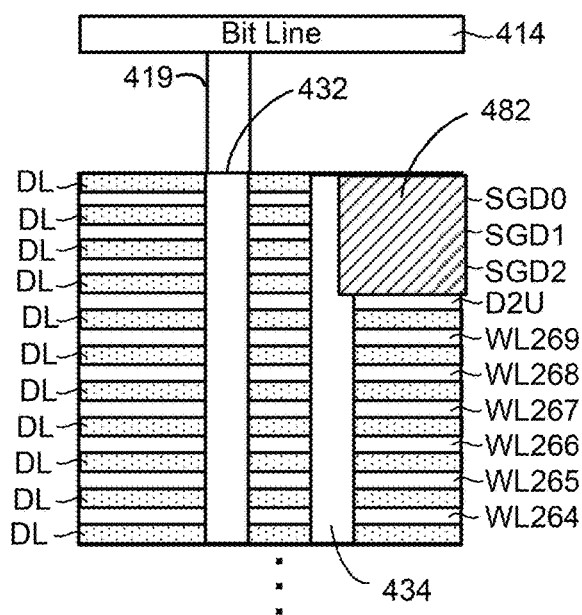
FIG. 4E depicts a cross sectional view of a portion of one embodiment of a block of memory cells.

FIG. 4E depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4E shows the same alternating conductive and dielectric layers as FIG. 4D. FIG. 4E also shows isolation region 482. Isolation regions 480, 482, 484, 486 and 488) occupy space that would have been used for a portion of the memory holes/vertical columns/NAND strings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, and SGD2 has a semi-circular cross section. In one embodiment, after the stack of alternating conductive and dielectric layers is formed, the stack is etched to create space for the isolation region and that space is then filled in with $SiO_2$.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DL, as well as word line layers WL264, WL265, WL266, WL267, and WL268. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL268 and a portion of vertical column 472 comprise a memory cell MC1. Word line layer WL267 and a portion of vertical column 472 comprise a memory cell MC2. Word line layer WL266 and a portion of vertical column 472 comprise a memory cell MC3. Word line layer WL265 and a portion of vertical column 472 comprise a memory cell MC4. Word line layer WL264 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
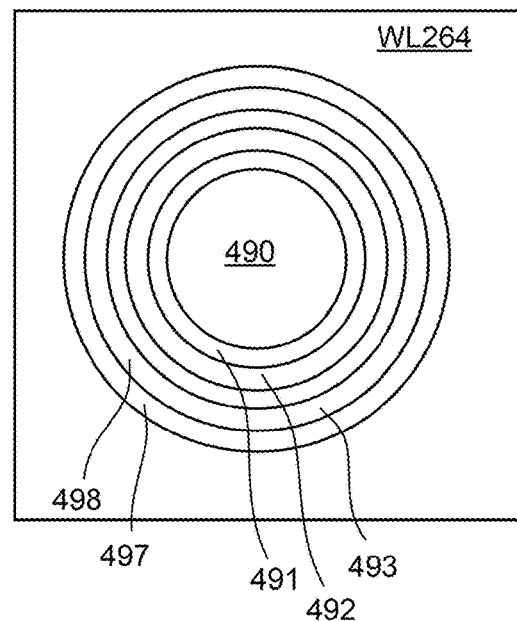
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL264, inner core 490, channel 491, tunneling dielectric 492, charge trapping layer 493, aluminum oxide layer 497, and blocking oxide layer 498.

Figure 4H:
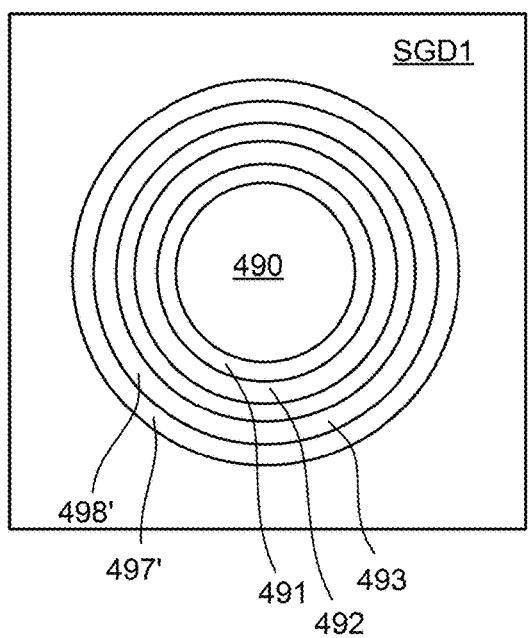
FIG. 4H depicts a cross section of as memory hole that implements a vertical NAND string.

FIG. 4H shows a cross section of vertical column 472 cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
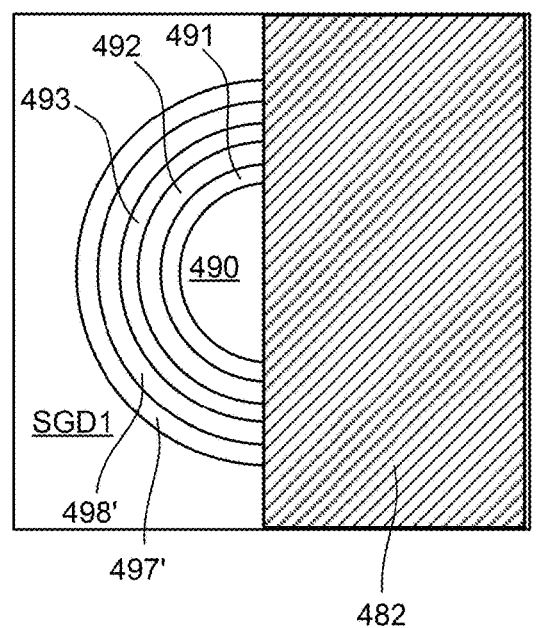
FIG. 4I depicts a cross section of as memory hole that implements a vertical NAND string.

FIG. 4I shows a cross section of vertical column 434 cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer) of vertical column 434 is semicircular in shape (or partially circular in shape) due to vertical column (NAND string) 434 intersecting isolation region 482.

Figure 4J:
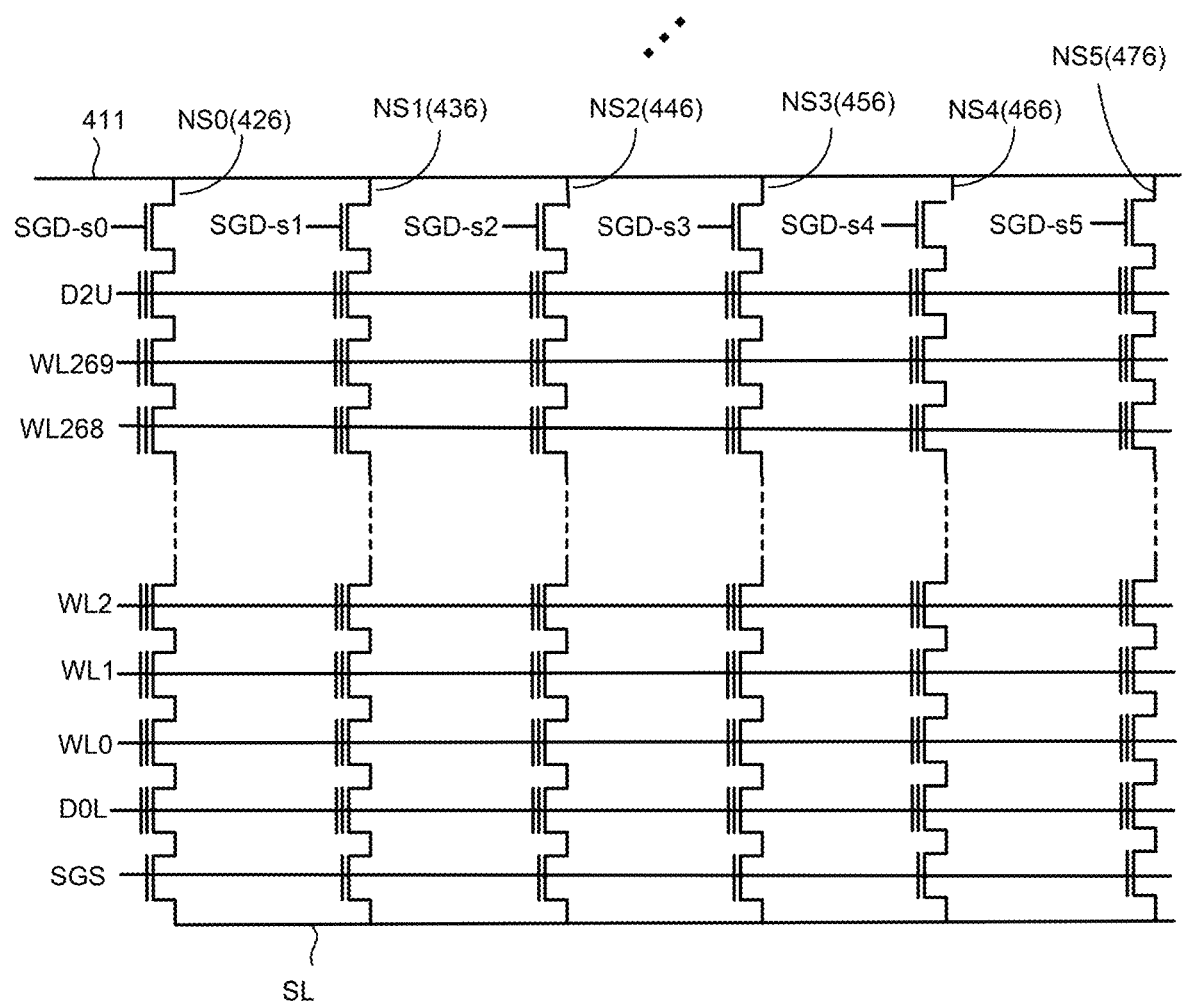
FIG. 4J is a schematic of a plurality of NAND strings.

FIG. 4J is a schematic diagram of a portion of the memory array 202 depicted in in FIGS. 4-4I. FIG. 4J shows physical data word lines WL0-WL269 running across the entire block. The structure of FIG. 4J corresponds to a portion 406 in Block 2 of FIG. 4A, including bit line 411. Within the block, in one embodiment, each bit line is connected to six NAND strings. Thus, FIG. 4J shows bit line 411 connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each region separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4J as SGS. Although the select gates SGD-s0, SGD-s1, SGD-s2, SGD-s3, SGD-s4, and SGD-s5 are isolated from each other due to the isolation regions, the data word lines WL0-WL269 of each region are connected together. As can be seen from FIG. 4J, each word line (including a word line selected for a memory operation) is connected to memory cells in one block, memory cell in multiple regions (e.g., 420, 430, 44, 450, 460 and 470) of the block and to memory cells in one sub-block (e.g., SB0, SB1 or Sb2) of the block. FIG. 4J only shows the NAND strings connected to bit line 411. However, a full schematic of the block would show every bit line and six vertical NAND strings connected to each bit line.

Although the example memory of FIGS. 4-4J is a three dimensional memory structure that includes vertical NAND strings with charge-trapping material, other (2D and 3D) memory structures can also be used with the technology described herein.

Figure 5A:
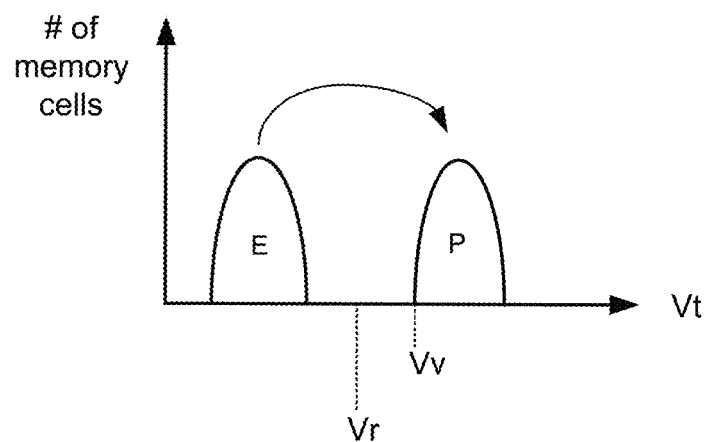
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
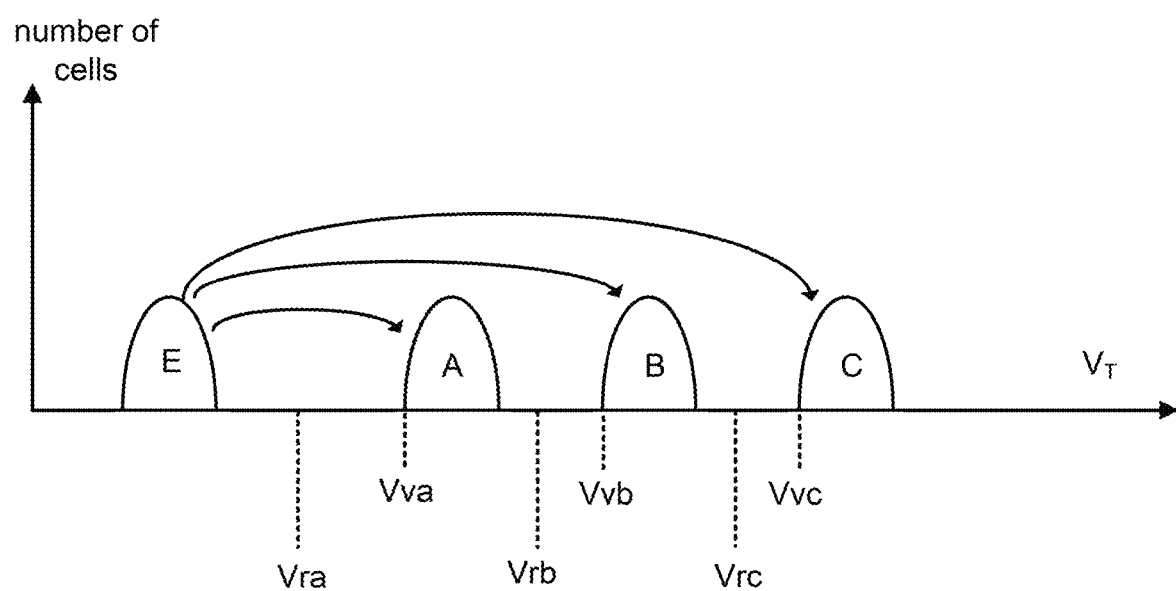
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
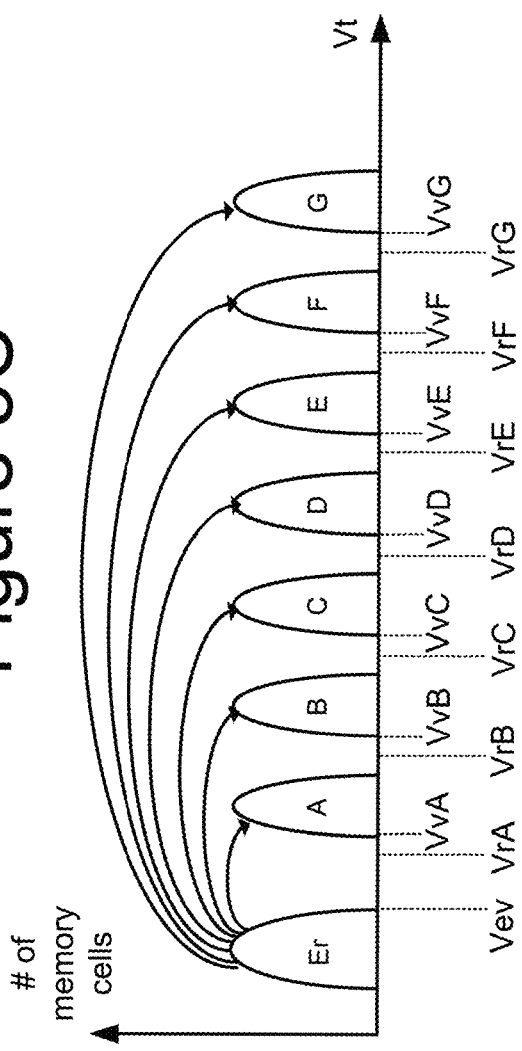
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the con- When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 1  | 1   | 0   | 0   | 0   | 1   |     |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   | duction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
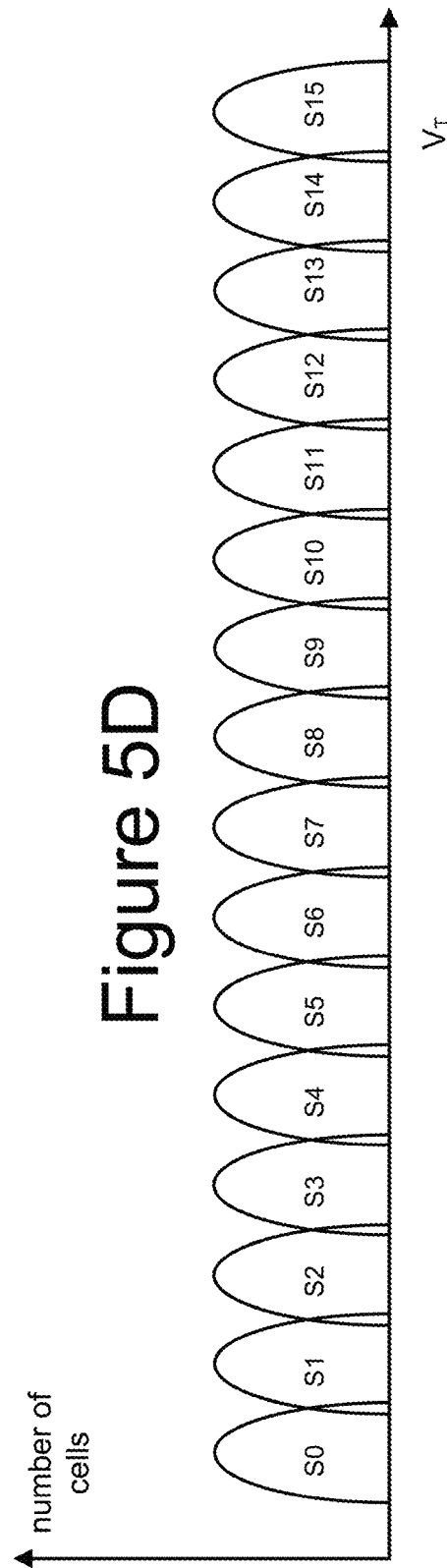
FIG. 5D depicts threshold voltage distributions.
Figure 5E:
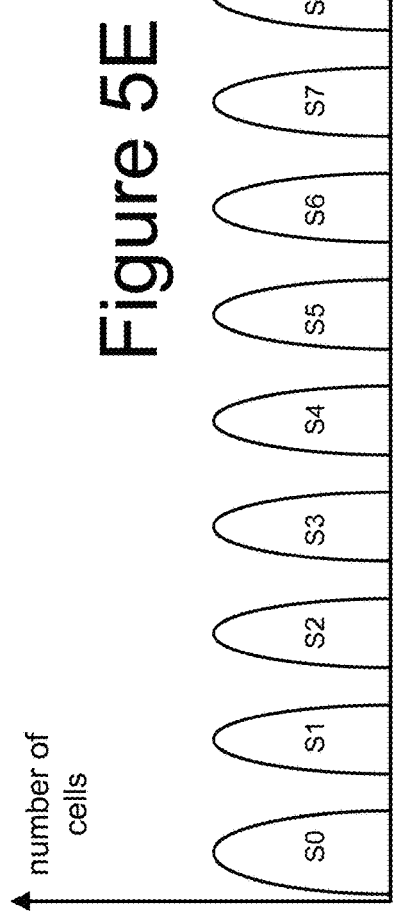
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

Figure 5F:
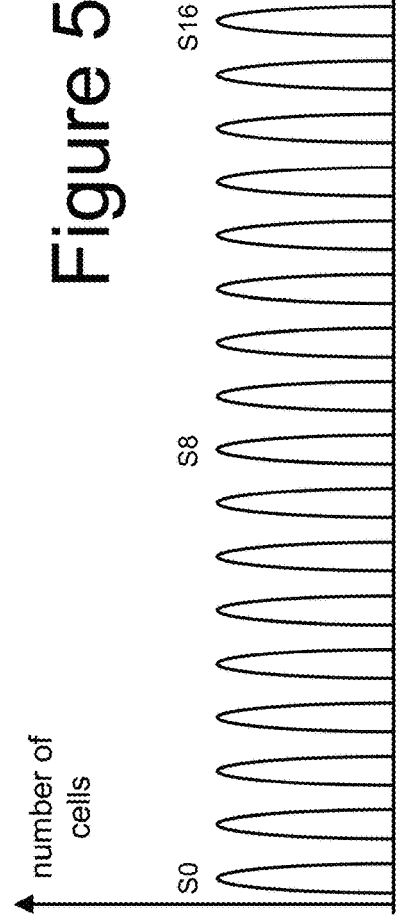
FIG. 5F depicts threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
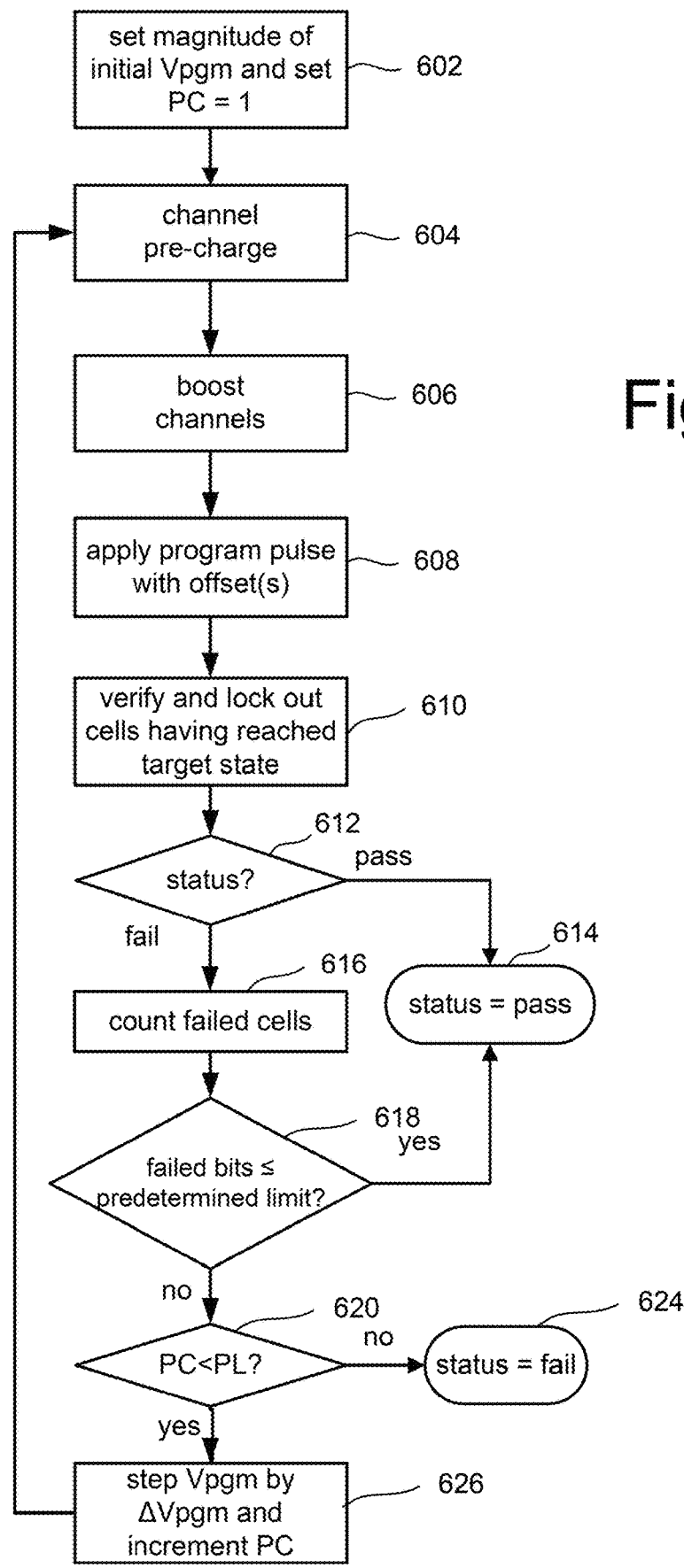
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops (referred to as program loops), each of which includes a program phase and a verify phase. The process of FIG. 6 is performed to implement the full sequence programming, as well as other programming schemes including multi-pass programming, which comprises programming processes that use multiple passes to complete programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In some embodiments, pre-charging the channels of unselected NAND strings cleans out the channel of electrons and raises the channel to a low positive voltage (e.g., approximately 1-1.3 v). In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). In some embodiments, the magnitude and/or pulse width of the program voltage pulse can be modified from the standard magnitude and/or pulse width by one or more offsets, as described below. If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In one embodiment that corresponds to FIG. 5C, the process of FIG. 6 is concurrently performed for memory cells being programmed to data states A, B, C, D, E, F and G. In one embodiment, step 610 can include testing for each of data states A, B, C, D, E, F and G (e.g., testing to see whether memory cells have threshold voltages greater than VvA, VvB, VvC, VvD, VvE, VvF, and VvG). In another embodiment, the system only tests for a subset of data states A, B, C, D, E, F and G during each loop of steps 604-626 based on the current threshold voltages of the memory cells, in what is known as a smart verify process. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another loop (steps 604-626) of the programming process of FIG. 6 is performed. The loop (steps 604-626) of the programming process of FIG. 6 is referred to as a program loop.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL269.

In another embodiment, memory cells are programmed in an order from the drain side to the source side. For example, first the process of FIG. 6 is performed to program memory cells connected to WL269, followed by using the process of FIG. 6 to program memory cells connected to WL268, followed by using the process of FIG. 6 to program memory cells connected to WL267, followed by using the process of FIG. 6 to program memory cells connected to WL266, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

In one embodiment, the memory structure can be operated in sub-block mode, which allows any sub-block to be programmed or read individually. That is, SB 1 can be programmed before or after SB0 and/or SB2; SB0 can be programmed before or after SB 1 and/or SB2; and SB2 can be programmed before or after SB0 and/or SB1. Any order of programming the sub-blocks can be used. Each sub-block can be read without reading the other sub-blocks. When programming a sub-block, the memory cells can be programmed in an order from source side toward drain side or from drain side to source side, for example with respect to SB1 programming source side to drain side comprises programming memory cells connected to WL90, followed by programming memory cells connected to WL91, followed by programming memory cells connected to WL92, . . . programming memory cells connected to WL179, and programming drain side to source side comprises programming memory cells connected to WL179, followed by programming memory cells connected to WL178, followed by programming memory cells connected to WL177, . . . programming memory cells connected to WL90. In some example, sub-blocks can be erased independently while in other examples, the entire block is erased at one time.

Figure 7:
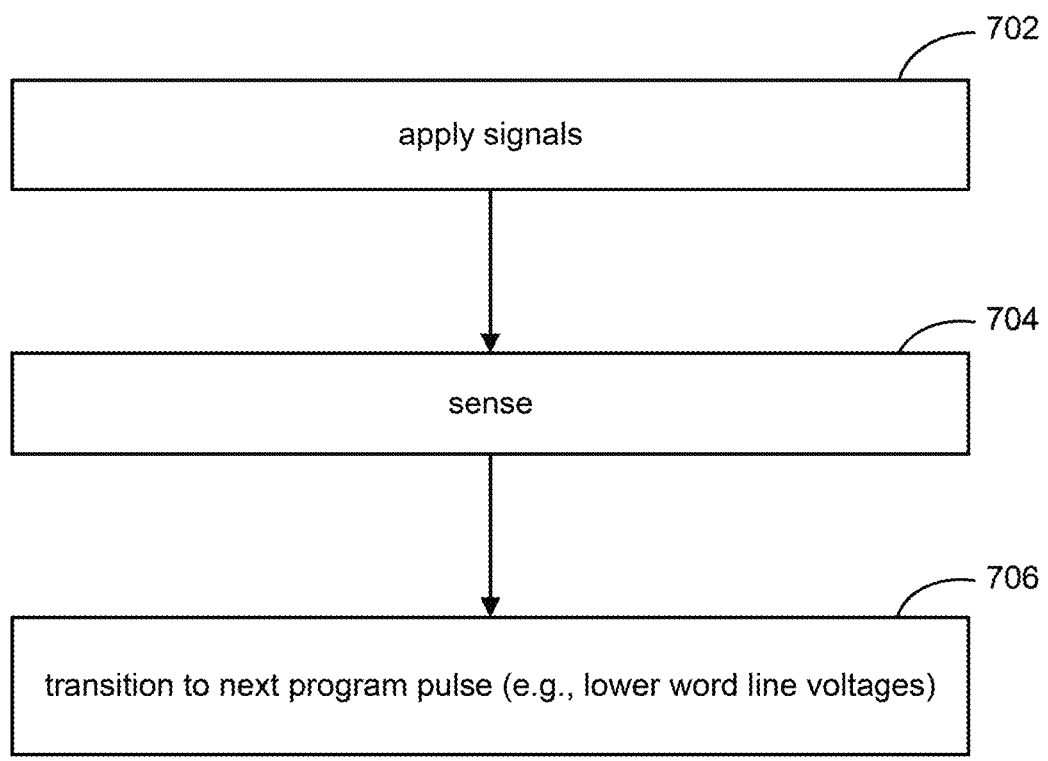
FIG. 7 is a flow chart describing one embodiment of a process for performing program-verify.

FIG. 7 is a flow chart describing one embodiment of a process for performing program-verify. That is, the process of FIG. 7 is an example implementation of a portion of step 610 of FIG. 6. In step 702 of FIG. 7, the appropriate signals are applied to the word lines, bit lines, source line and select lines to perform a sensing at one or more of the verify compare voltages (e.g., VvA, VvB, VvC, VvD, VvE, VvF, and VvG of FIG. 5C). In step 704, the sensing is performed to determine whether the selected memory cells being programmed have threshold voltages greater than the verify compare voltage being tested for. In step 706, the systems transitions from program-verify to the next program loop (including the next program pulse). For example, the system lowers all of the word line voltages to ground (or one or more other resting voltages) in preparation for the next program loop (e.g. steps 640-626).

In some circumstances, when transitioning from program-verify to the next program loop the channels of unselected NAND strings could be unwantedly pulled down to a negative voltage, which may undermine subsequent boosting and lead to a disturb. This concept is explained in more detail by FIGS. 8-11.

Figure 8:
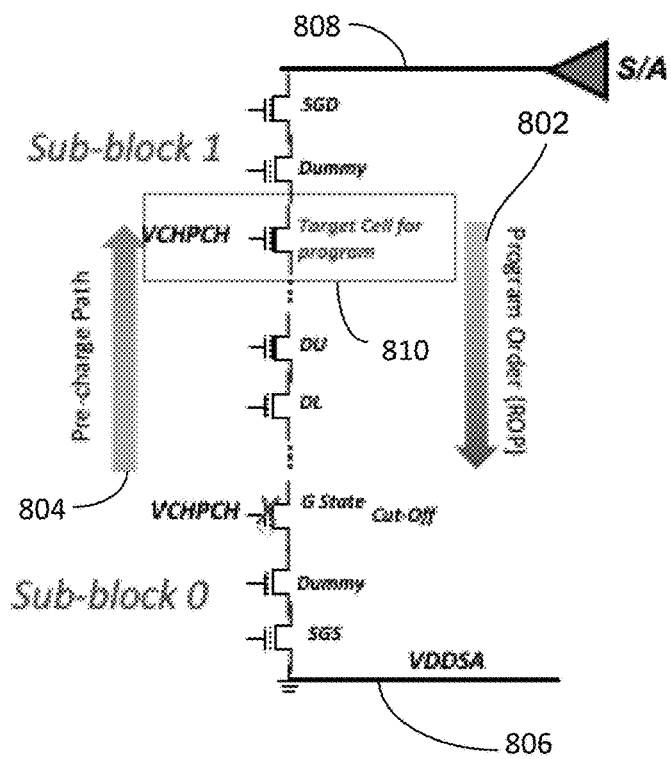
FIG. 8 depicts a NAND string being pre-charged as part of a process to inhibit the NAND string from programming during a programming process.

FIG. 8 depicts a NAND string being pre-charged as part of a process to inhibit the NAND string from programming during a programming process. In this example, the block that the depicted NAND string resides in is divided into two sub-blocks (Sub-block 1 and Sub-block 2) and the order of programming is from the drain side to the source side (as depicted by arrow 802). Additionally, in this example, the pre-charging is performed from the source side (see arrow 804), as the source line 806 is connected to VDDSA (a pre-charge voltage of ~2.0-2.5 v) and the bit line 808 is connected to a sense amplifier (S/A). All of the memory cells (via word lines) receive VCHPCH (~1.3 v). SGD represents the drain side select gate. SGS represents the source side select gate. DU is a dummy memory cell in Sub-block 1 and DL is a dummy memory cell in Sub-block 0 such that the border between Sub-block 0 and Sub-block 1 is between (or near) DU and DL. The target memory cell for programming is indicated by box 810, and resides in Sub-block 1.

Figure 9:
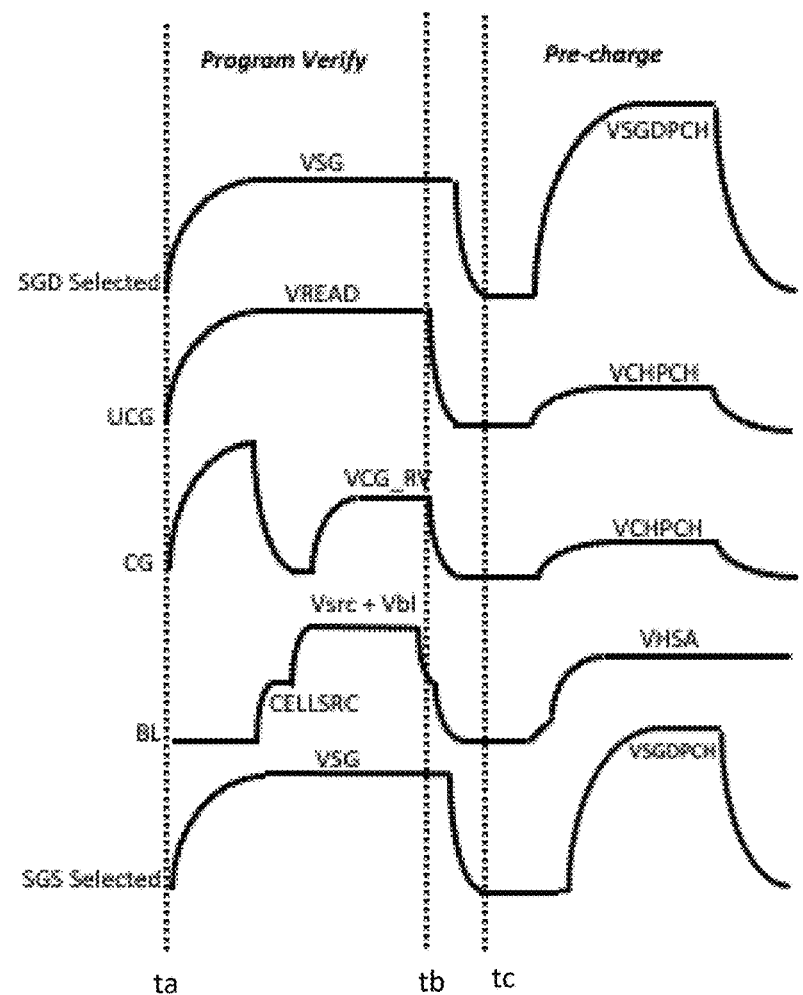
FIG. 9 is a signal diagram describing the behavior of various signals during program-verify and pre-charging.

FIG. 9 is a signal diagram describing the behavior of various signals for the structure of FIG. 8 during program-verify and pre-charging. FIG. 9 shows the following signals: SGD selected, UCG, CG, BL and SGS Selected. The signal SGD selected is the drain side selection signal (SGD) for the selected region (e.g. of regions 420, 430, 440, 450, 460 and 470). UCG is the signal applied to all unselected word lines. CG is the signal applied to the selected word line (the word line connected to the memory cells selected for programming). BL is the signal applied to the bit lines of the block. SGS selected is the signal applied to the source side selected lines (SGS0, SGS1, SGS2). At time ta, SGD Selected is raised to VSG (which is a voltage high enough to turn on the transistor for the select gate ~3.5-6 v), UCG is raised to Vread (e.g., 7-10 volts), a voltage spike is applied to CG, and SGS Selected is raised to VSG. Vread is an example of an overdrive voltage that is used to turn on the memory cells so they fully conduct current regardless of which data state the memory cell is in. Shortly after the voltage spike, CG is raised in VCG_RV, which can be any of the verify compare voltages (e.g., VvA, VvB, VvC, VvD, VvE, VvF, and VvG of FIG. 5C) and the bit lines BL are raised to Vsrc+Vb1 (0.5-1.5 v). The voltage Vsrc is the voltage of the source line, not depicted in FIG. 9, which can be at ground or a low voltage near ground. While CG is at VCG_RV, the memory cells are sensed to see whether they have successfully reached their target threshold voltage. The time period of ta-tb represents steps 702 and 704 of FIG. 7. Between tb and tc, all of the signals depicted in FIG. 9 are lowered to ground. The time period of tb-tc represents step 706 of FIG. 7. Starting at time tc, the pre-charge process is performed (e.g., step 604 of FIG. 6). The signal SGD Selected is raised to VSGDPCH, UCG and CG are raised to VCHPCH, the bit lines BL are raised to VHSA (~3.5 v), and SGS Selected is raised to VSGDPCH.

An issue regarding the channels of unselected NAND strings being pulled down to a negative voltage occurs between tb and tc. As the voltages ramp down on the word lines (CG and UCG), when the voltage on the word lines reach the threshold voltages of the memory cells, the channel will be cut off and will float. The floating channels couple to the word lines, but with the word lines continuing to ramp down the channel potential will become negative. Therefore, the pre-charging will start from a negative voltage. In some circumstances, the pre-charge will clear out the electrons in the channel and raise the potential of the channel to a positive voltage (e.g., 1-1.3 v). However, if the memory is in sub-block mode such that Sub-block 0 has already been programmed, when trying to program memory cells in Sub-Block 1, then a memory cell of Sub-Block 0 in a high data state (e.g. data state G—see FIG. 5C) may not turn on in response to VCPCH; thereby, keeping the channel cut off and maintaining the channel at the negative voltage during an attempted pre-charge. If the boosting of step 606 starts with the channel at a negative potential, then the boosting may not get the potential of the channel high enough to avoid a disturb to memory cells of the unselected NAND strings that are connected to the selected word line (CG). As an example, disturbed memory cells may have their threshold voltage increased, resulting in an error in the data being stored.

Figure 10:
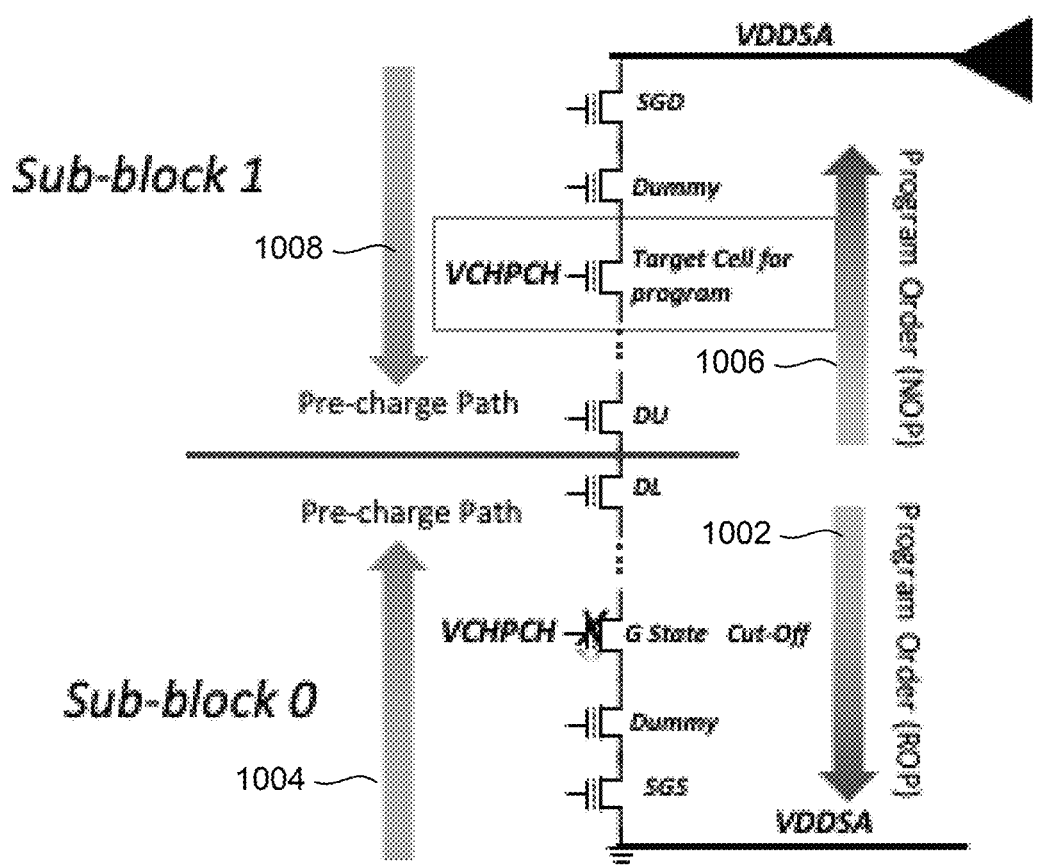
FIG. 10 depicts a NAND string being pre-charged as part of a process to inhibit the NAND string from programming during a programming process.

FIG. 10 depicts a NAND string being pre-charged as part of a process to inhibit the NAND string from programming during a programming process. In the example of FIG. 10, the order of programming Sub-Block 0 is from the drain side to the source side (as per arrow 1002) and the source of pre-charging when programming memory cells of Sub-Block 0 is from the source line (as per arrow 1004). The order of programming Sub-Block 1 is from the source side to the drain side (as per arrow 1006) and the source of pre-charging when programming memory cells of Sub-Block 1 is from the bit line (as per arrow 1008). When the structure of FIG. 10 transitions from program-verify to the pre-charging of the next program loop (see FIG. 6) by lowering the word line voltages, the channels of unselected NAND strings may couple down to a negative voltage (as discussed above with respect to FIGS. 8-9). However, since Sub-Block 1 pre-charges from the bit line then regardless of whether Sub-Block 0 is programmed or not, Sub-Block 1 can pre-charge and the potential of the channel can be raised to −1-1.3.v prior to the boosting. Similarly, because Sub-block 0 pre-charges from the source line, then regardless of whether Sub-Block 1 is programmed or not, Sub-Block 0 can pre-charge and the potential of the channel can be raised to 1-1.3.v prior to the boosting. This scheme of pre-charge paths and order of programming solves the problem of channels of unselected NAND strings being coupled down to a negative voltage and undermining subsequent boosting (which can lead to a disturb). However, the structure of FIG. 10 is for a two tier architecture. FIGS. 4C and 4D show a three tier architecture. The solution to the problem of channels of unselected NAND strings being coupled down to a negative voltage depicted in FIG. 10 may not work for a three tier architecture, as described below with respect to FIG. 11.

Figure 11:
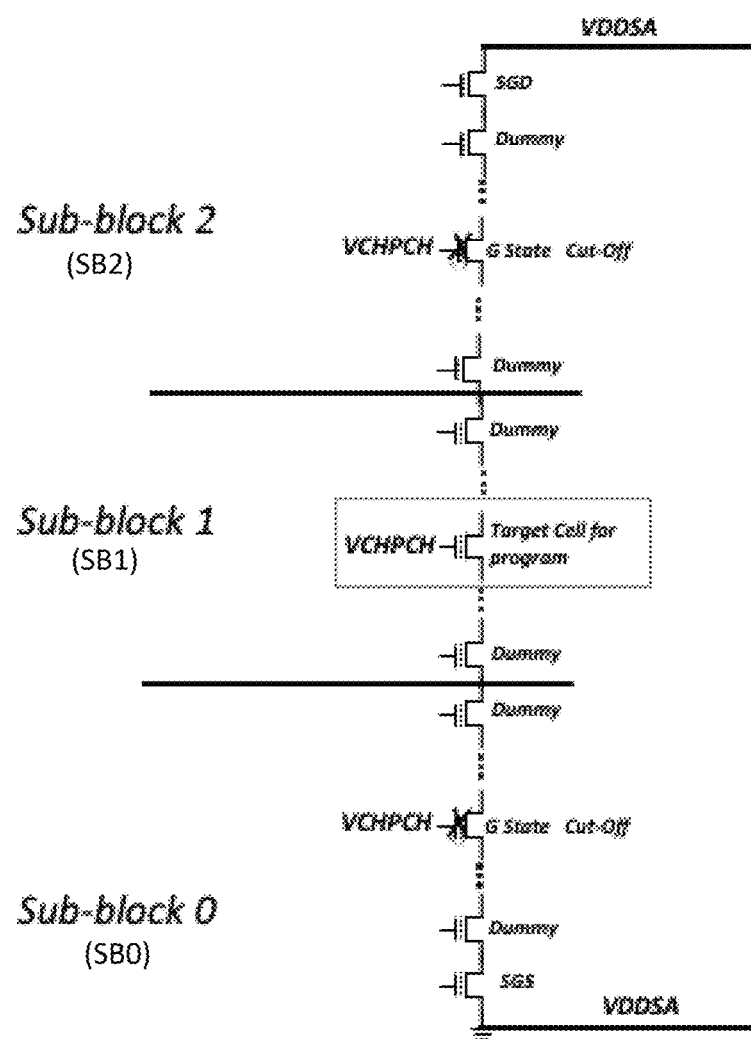
FIG. 11 depicts a NAND string being pre-charged as part of a process to inhibit the NAND string from programming during a programming process.

FIG. 11 depicts a NAND string being pre-charged as part of a process to inhibit the NAND string from programming during a programming process. The NAND string of FIG. 11 is part of a three tier architecture, as previously described by FIGS. 4C and 4D. It is possible that when programming Sub-block 0, the order of programming is drain side to source side and the pre-charging is from the source line, as described above with respect to FIG. 10, such that programming Sub-block 0 will not have the problem of channels of unselected NAND strings being coupled down to a negative voltage prior to boosting as described above.

It is also possible that when programming Sub-block 2, the order of programming is source side to drain side and the pre-charging is from the bit line, as described above for Sub-block 1 of FIG. 10, such that programming Sub-block 2 will not have the problem of channels of unselected NAND strings being coupled down to a negative voltage prior to boosting as described above. However, when programming Sub-block 1 (the middle sub-block) of FIG. 11, if Sub-block 0 is already programmed then the channels of Sub-block 1 will not be able to be pre-charged from the source line and if Sub-block 2 is already programmed then the channels of Sub-block 1 will not be able to be pre-charged from the bit line; therefore, Sub-block 1 may not access to a source of pre-charging. Without proper pre-charging, the boosting of channels of unselected memory cells may not be successful in preventing a disturb for the reasons discussed above regarding the NAND channel being at a negative voltage after the previous program-verify.

To overcome the issue of the NAND channel being at a negative voltage after the previous program-verify, it is proposed to pre-charge the channels of unselected memory cells while lowering voltages at the end of program-verify by applying overdrive voltages to data word lines in a sub-block closer to the source line than the selected sub-block and lowering to a resting voltage (e.g., 0 volts, ground, or Vss) a dummy word line between the selected sub-block and the sub-block closer to the source line prior to lowering to the resting voltage the data word lines in the sub-block closer to the source line. More details are provided below with respect to FIGS. 12-19.

Figure 12:
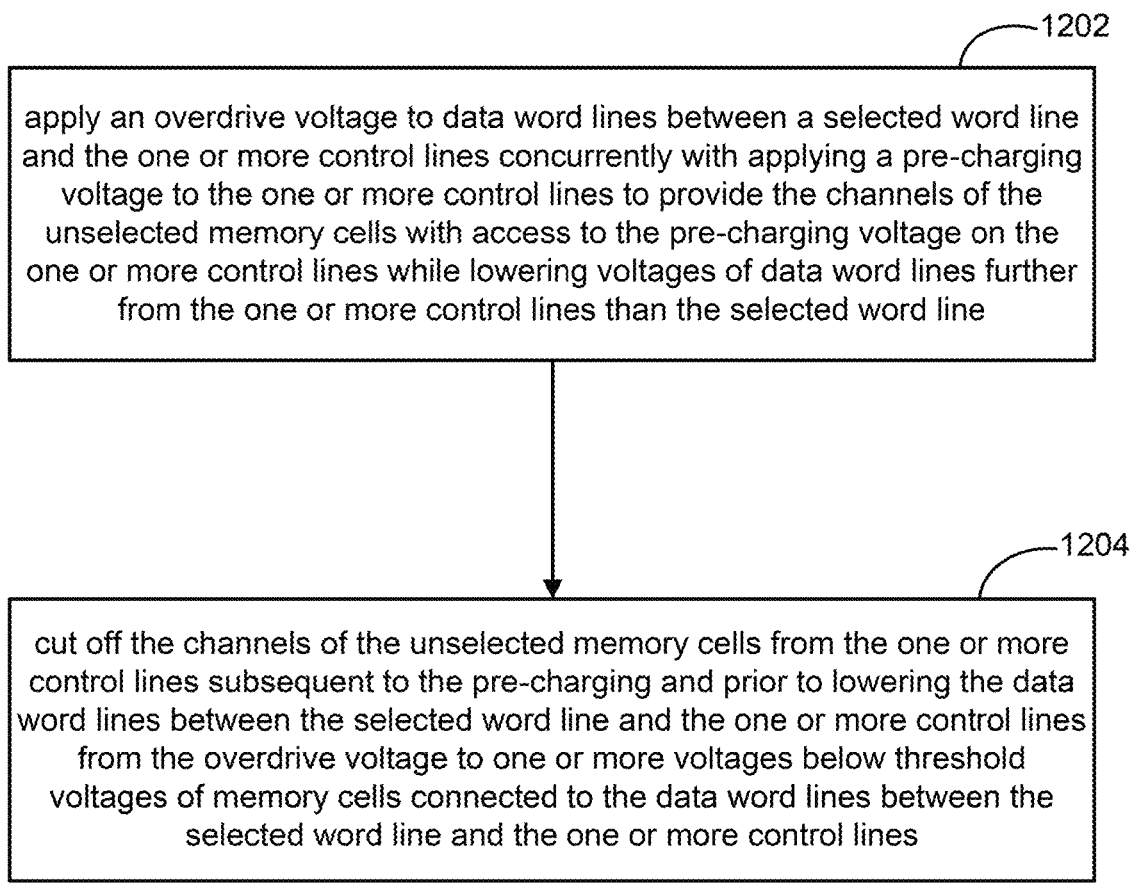
FIG. 12 is a flow chart describing one embodiment of a process that includes pre-charging the channels of unselected memory cells while lowering voltages at the end of program-verify.

FIG. 12 is a flow chart describing one embodiment of a process that includes pre-charging the channels of unselected memory cells while lowering voltages at the end of program-verify by applying overdrive voltages to data word lines in a sub-block closer to the source line than the selected sub-block and lowering to a resting voltage a dummy word line between the selected sub-block and the sub-block closer to the source line prior to lowering to the resting voltage the data word lines in the sub-block closer to the source line. The process of FIG. 12 is an example implementation of step 706 of FIG. 7. The process of FIG. 12 can be performed by any one of the one or more control circuits discussed above. The process of FIG. 12 can be performed entirely by a control circuit on memory die 200 (see FIG. 2A) or entirely by a control circuit on integrated memory assembly 207 (see FIG. 2B), rather than by memory controller 120. In one example, the process of FIG. 12 is performed by or at the direction of state machine 262, using other components of System Control Logic 260, Column Control Circuitry 210 and Row Control Circuitry 220. In another embodiment, the process of FIG. 12 is performed by or at the direction of memory controller 120. In one embodiment, the process of FIG. 12 is performed on a block of non-volatile memory cells such that the block is the unit of erase. In another embodiment, a different grouping of memory cells can be the unit of erase. In another embodiment, the process of FIG. 12 is performed on a different grouping of non-volatile memory cells.

In step 1202, the control circuit applies an overdrive voltage to data word lines between a selected word line and the one or more control lines (e.g., source lines or other control lines) concurrently with applying a pre-charging voltage to the one or more control lines to provide the channels of the unselected memory cells with access to the pre-charging voltage on the one or more control lines while lowering voltages of data word lines further from the one or more control lines than the selected word line. For purposes of this document, an overdrive voltage is a voltage of sufficient magnitude that it can turn on the memory cells so they fully conduct current regardless of which data state the memory cells are in. For example, the control circuit applies Vread (an example of an overdrive voltage) to the data word lines of SB0 during a programming process that programs memory cells connected to WLn of SB1 concurrently with applying a pre-charging voltage to the source line SL so that channels of the NAND strings under WLn in SB1 have access to and can pre-charge from the source line while lowering the voltages to ground on the data word lines of SB2 at the end of program-verify.

In step 1204, the control circuit cuts off the channels of the unselected memory cells from the one or more control lines subsequent to the pre-charging and prior to lowering the data word lines between the selected word line and the one or more control lines from the overdrive voltage to one or more voltages below threshold voltages of memory cells connected to the data word lines between the selected word line and the one or more control lines. For example, after the channels of the NAND strings under WLn in SB1 have reached a sufficient pre-charge level, a dummy word line between SB0 and SB1 (e.g., D0U, D1L or both) can be lowered to ground (or another resting voltage) in order to cut off the channels of the NAND strings under WLn in SB1 from the source line SL. Subsequent to cutting off the channels of the NAND strings under WLn in SB1 from the source line SL, the data word lines of SB0 are lowered to ground (or another resting voltage). For purposes of this document, a resting voltage is a voltage that is low in magnitude (e.g., 0 volts or close to 0 volts) that a signal line is lowered to between operations (e.g., between pre-charge and boost, between program-verify and pre-charge, etc.).

Figure 13:
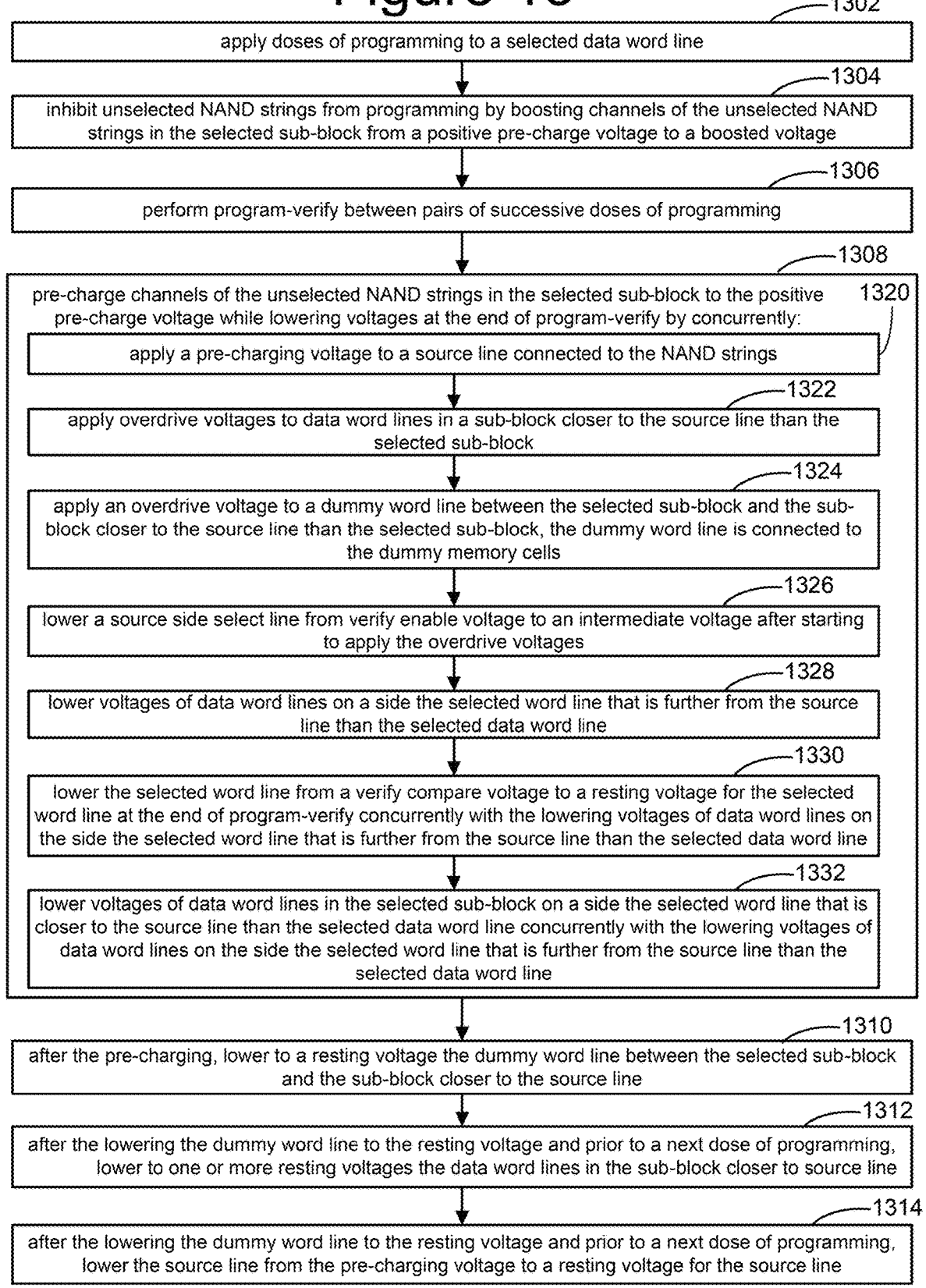
FIG. 13 is a flow chart describing one embodiment of a process for programming that includes pre-charging the channels of unselected memory cells while lowering voltages at the end of program-verify.

FIG. 13 is a flow chart describing one embodiment of a programming process that includes pre-charging the channels of unselected memory cells while lowering voltages at the end of program-verify by applying overdrive voltages to data word lines in a sub-block closer to the source line than the selected sub-block and lowering to a resting voltage a dummy word line between the selected sub-block and the sub-block closer to the source line prior to lowering to the resting voltage the data word lines in the sub-block closer to the source line. The process of FIG. 13 is an example implementation of steps 604-610 of FIG. 6. Additionally, the process of FIG. 13 includes an example implementation of the process of FIG. 12. The process of FIG. 13 can be performed by any one of the one or more control circuits discussed above. The process of FIG. 13 can be performed entirely by a control circuit on memory die 200 (see FIG. 2A) or entirely by a control circuit on integrated memory assembly 207 (see FIG. 2B), rather than by memory controller 120. In one example, the process of FIG. 13 is performed by or at the direction of state machine 262, using other components of System Control Logic 260, Column Control Circuitry 210 and Row Control Circuitry 220. In another embodiment, the process of FIG. 13 is performed by or at the direction of memory controller 120. Note that the steps of FIG. 13 can be performed in different orders than depicted in the drawing.

In one embodiment, the process of FIG. 13 is performed on a block of non-volatile memory cells such that the block is the unit of erase. In another embodiment, a different grouping of memory cells can be the unit of erase. In another embodiment, the process of FIG. 13 is performed on a different grouping of non-volatile memory cells. In one embodiment, the process of FIG. 13 is performed on a memory comprising a plurality of data word lines connected to multiple NAND strings that form a block having at least three sub-blocks, each NAND string includes memory cells in each of the three sub-blocks, the selected word line WLn is in a selected sub-block, and each NAND string includes one or more dummy memory cells. Additionally, in some embodiments, each NAND string includes a source side select gate between memory cells and the source line, and the source side select line is connected to the source side select gates.

In step 1302 of FIG. 13, the control circuit applies doses of programming to a selected data word line. For example, a series of program voltage pulses (e.g. see, step 608 of FIG. 6) are applied to the selected word line WLn. In step 1304, the control circuit inhibits unselected NAND strings from programming by boosting channels of the unselected NAND strings in the selected sub-block from a positive pre-charge voltage to a boosted voltage (e.g. see, step 606 of FIG. 6). In step 1306, the control circuit performs program-verify between pairs of successive doses of programming (e.g. see, step 610 of FIG. 6). In step 1308, the control circuit pre-charges channels of the unselected NAND strings in the selected sub-block to the positive pre-charge voltage while lowering voltages at the end of program-verify.

In one embodiment of step 1308, the control circuit pre-charges channels of the unselected NAND strings in the selected sub-block to the positive pre-charge voltage while lowering voltages at the end of program-verify by concurrently performing steps 1320-1332.

In step 1320, the control circuit applies a pre-charging voltage to a source line SL connected to the NAND strings. In step 1322, the control circuit applies overdrive voltages (e.g., Vread) to data word lines in a sub-block (e.g., SB0) closer to the source line than the selected sub-block (e.g., SB1). In step 1324, the control circuit applies an overdrive voltage to a dummy word line (e.g., D0U, D1L or both) between the selected sub-block and the sub-block closer to the source line than the selected sub-block (the dummy word line is connected to the dummy memory cells). In step 1326, the control circuit lowers a source side select line (e.g., SGS) from a verify enable voltage to an intermediate voltage after starting to apply the overdrive voltages. In one embodiment, the intermediate voltage is higher in magnitude than threshold voltages of the source side select gates. In step 1328, the control circuit lowers voltages of data word lines (e.g., WLn+1-WL269) on a side the selected word line that is further from the source line than the selected data word line. In step 1330, the control circuit lowers the selected word line (WLn) from a verify compare voltage (e.g., VvA, VvB, VvC, VvD, VvE, VvF, and VvG) to a resting voltage for the selected word line at the end of program-verify concurrently with the lowering voltages of data word lines on the side the selected word line that is further from the source line than the selected data word line. In step 1332, the control circuit lowers voltages of data word lines (e.g., WL90-WLn−1) in the selected sub-block on a side the selected word line that is closer to the source line than the selected data word line concurrently with the lowering voltages of data word lines on the side the selected word line that is further from the source line than the selected data word line.

After pre-charging (in step 1308) the channels of the unselected NAND strings in the selected sub-block to the positive pre-charge voltage while lowering voltages at the end of program-verify, the control circuit (in step 1310) lowers to a resting voltage the dummy word line between the selected sub-block and the sub-block closer to the source line. After the lowering the dummy word line to the resting voltage in step 1310 and prior to a next dose of programming (e.g., the next program pulse), the control circuit (in step 1312) lowers to one or more resting voltages the data word lines in the sub-block closer to the source line. After the lowering the dummy word line to the resting voltage in step 1310 and prior to a next dose of programming (e.g., the next program pulse), the control circuit (in step 1314) lowers the source line from the pre-charging voltage to a resting voltage for the source line.

In one embodiment, the processes of FIGS. 12 and 13 are performed when programming the sub-blocks other than the sub-block closest to the source of pre-charging and not used when programming the sub-block closest to the source of pre-charging. For example, the processes of FIGS. 12 and 13 are performed when programming SB1 and SB2, but not when programming SB0.

Figure 14:
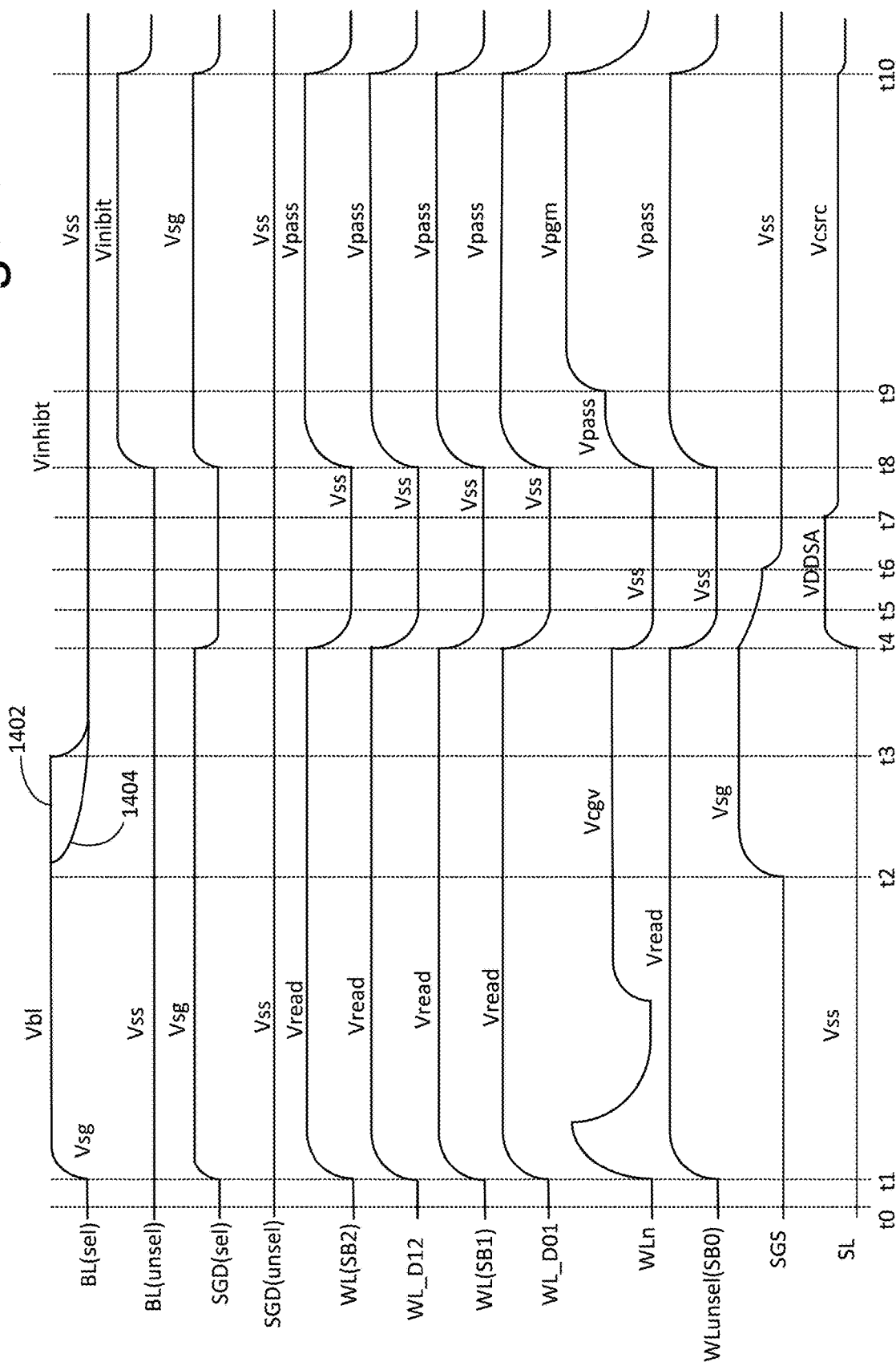
FIG. 14 is a signal diagram describing one embodiment of programming memory cells in a sub-block closest to the source line.
Figure 16:
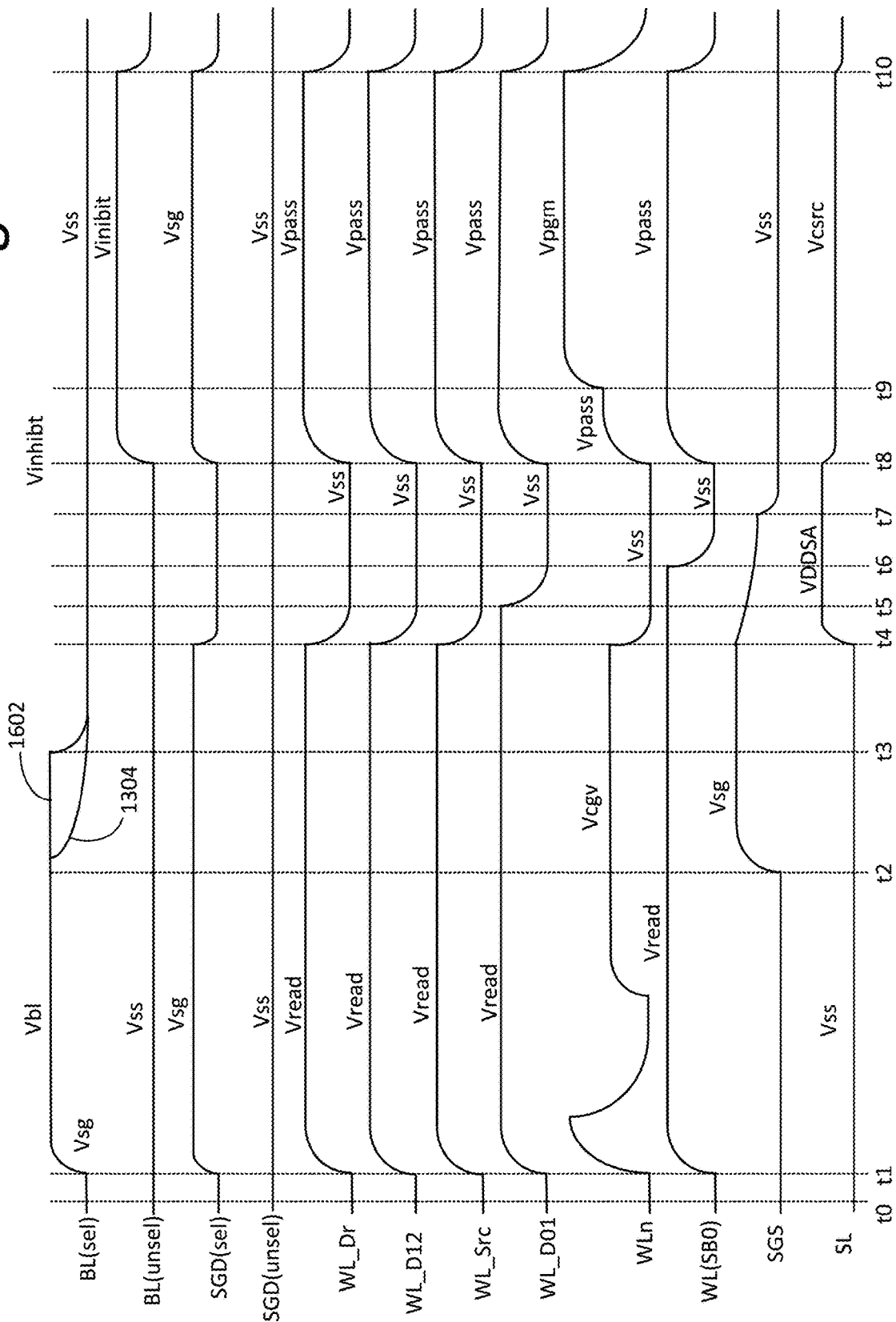
FIG. 16 is a signal diagram describing one embodiment of programming memory cells in a middle sub-block.
Figure 18:
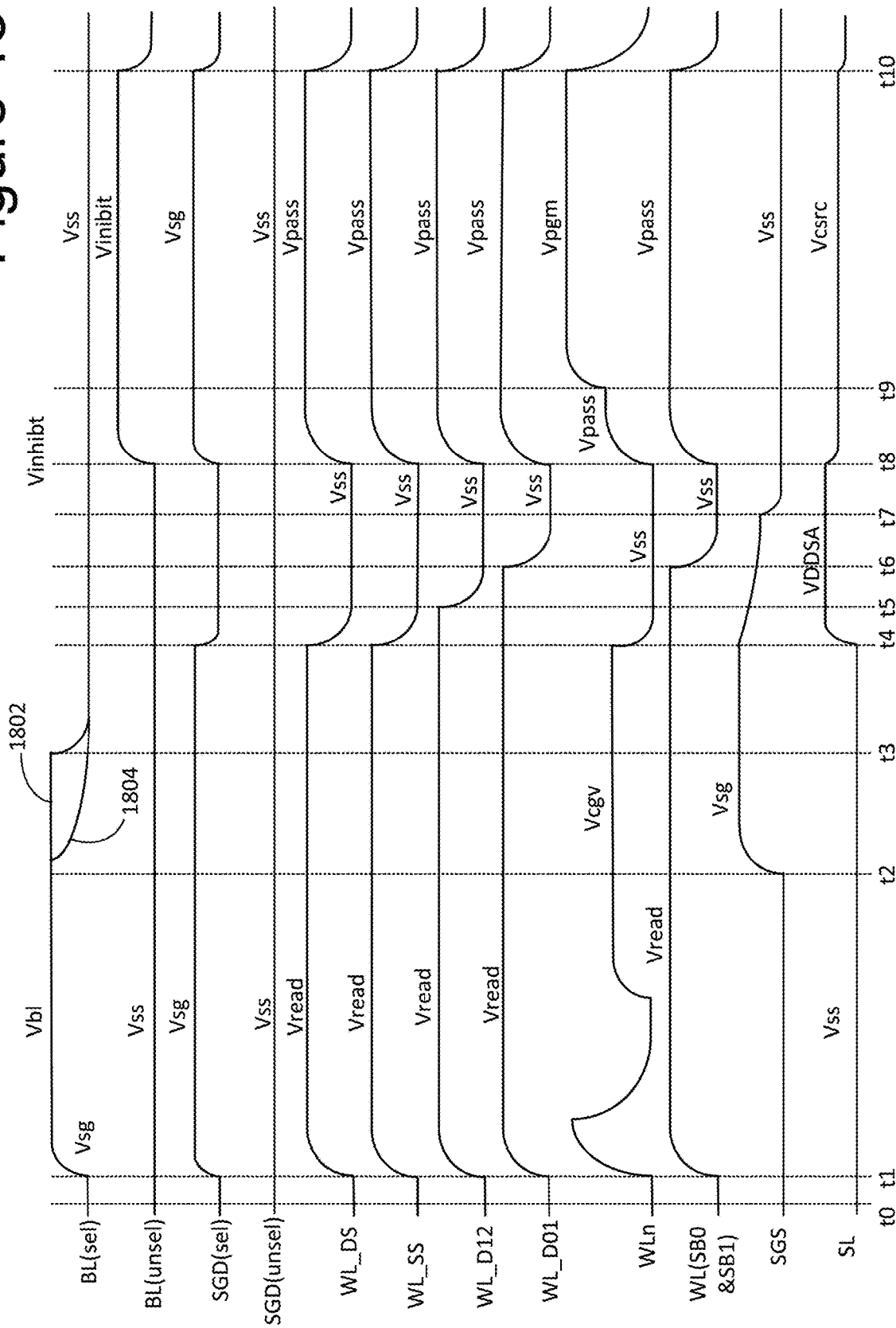
FIG. 18 is a signal diagram describing one embodiment of programming memory cells in a sub-block further from the source line.

FIGS. 14, 16 and 18 are signal diagrams that describe the behavior of various signals during program-verify/pre-charging/boosting/programming for a system that pre-charges the channels of unselected memory cells while lowering voltages at the end of program-verify. FIG. 14 is a signal diagram describing one embodiment of programming memory cells in a sub-block closest to the source line (e.g., SB0). The process depicted in FIG. 14 does use the processes of FIGS. 12 and 13. FIG. 16 is a signal diagram describing one embodiment of programming memory cells in a middle sub-block (e.g., SB1). The process depicted in FIG. 16 is an example implementation of the processes of FIGS. 12 and 13. FIG. 18 is a signal diagram describing one embodiment of programming memory cells in a sub-block further from the source line (e.g., SB2). The process depicted in FIG. 18 is another example implementation of the processes of FIGS. 12 and 13.

FIG. 14 depicts the following signals: BL(sel), BL(unsel), SGD(sel), SGD(unsel), WL(SB2), WL_D12, WLSB1, WL_D01, WLn, WLunsel(SB0), SGS and SL. BL(sel) is the voltage applied to bit lines connected to NAND strings having memory cells selected for programming. BL(unsel) is the voltage applied to bit lines connected to NAND strings that do not have any memory cells selected for programming. SGD(sel) is the voltage applied to the drain side select (SGD) lines (e.g., SGD0, SGD1 and SGD2 connected together for one region) for the region (e.g., regions 420, 430, 440, 450, 460 and 470) selected for programming. SGD(unsel) is the voltage applied to the drain side select (SGD) lines (e.g., SGD0, SGD1 and SGD2 connected together for one region) for the region (e.g., regions 420, 430, 440, 450, 460 and 470) not selected for programming. SGS is the voltage applied to the source side select (SGS) lines (e.g., SGS0, SGS1 and SGS2 connected together). SL is the voltage applied to the source line. WLn is the voltage on the data word line selected for programming, meaning that WLn is connected to the memory cells selected for programming. WL(SB2) are the data word lines of sub-block SB2 (e.g., WL180-WL269). WL_D12 are the one or more dummy word lines between sub-block SB1 and sub-block SB2 (e.g., D1U and D2L). WL_D01 are the one or more dummy word lines between sub-block SB0 and sub-block SB1 (e.g., D0U and D1L). WL(SB1) are the data word lines of sub-block SB1 (e.g., WL90-WL179). WLunsel (SB0) are the data word lines of sub-block SB0 that are not selected for programming (e.g., all of WL0-WL89 other than WLn).

Figure 15:
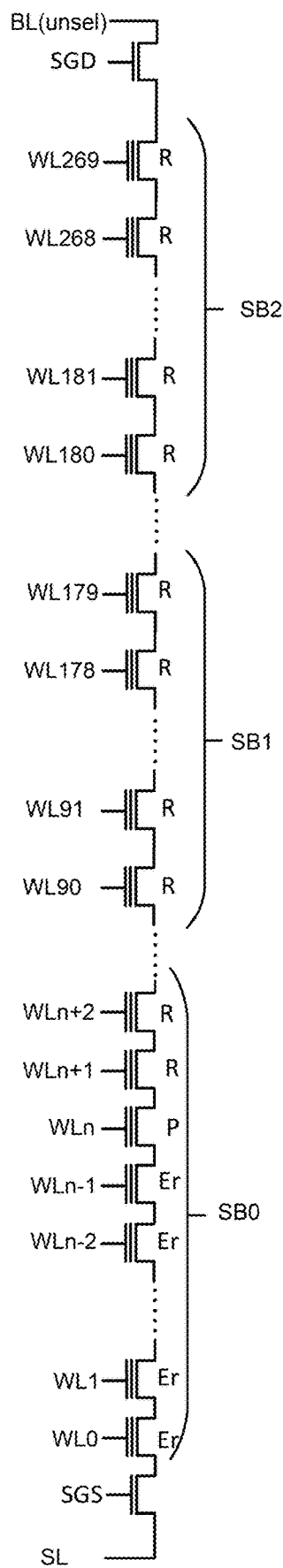
FIG. 15 depicts a NAND string.

FIG. 14 describes one embodiment of programming memory cells in SB0. FIG. 15 is an example NAND string of the block that is being operated on according to the process of FIG. 14. As such, WLn is in SB0 and the memory cell connected to WLn is being programmed (as per the P next to the memory cell). The memory cells of SB0 of the depicted NAND string that are on the drain side of WLn have already been programmed. The memory cells of SB0 of the depicted NAND string that are on the source side of WLn have not yet been programmed and, therefore, are in the erased state. In this example, memory cells of SB1 and SB2 have already been programmed. Those memory cells that have already received programming have an R next to them to indicate they are storing data (R is used to indicate that the data can be any random data state). Those memory cells that have not yet received programming have an Er next to them to indicate that they are in the erased state.

The time period of t1-t8 of FIG. 14 corresponds to program-verify (see step 610 of FIG. 6) during loop N of the program loops of steps 604-626. The time period of t4-t8 corresponds to the transition to the next program pulse (step 706 of FIG. 7). The time period of t4-t8 also corresponds to channel pre-charge (see step 604 of FIG. 6) during loop N+1 of the program loops of steps 604-626. The time period of t8-t10 corresponds to boosting channels of unselected NAND strings (see step 606 of FIG. 6) and applying a program voltage pulse to the selected data word line and selected memory cells (see step 608 of FIG. 6) during loop N+1 of the program loops of steps 604-626.

At time t0, all signals depicted in FIG. 14 are at Vss (ground or 0 volts). At time t1, BL(sel) is raised to Vb1 (e.g., 0.5-1.5 v), SGD(sel) is raised to Vsg (e.g., 4-6 v), WL(SB2) is raised to Vread (e.g., 7-10 volts), WL_D12 is raised to Vread, WL(SB1) is raised to Vread, and WL_D01 is raised to Vread. Also, at t1, a voltage spike is applied to WLn and subsequent to the voltage on WLn settling down then WLn is raised to Vcgv (which can be any of the verify compare voltages such as, for example, VvA, VvB, VvC, VvD, VvE, VvF, and VvG). At time t2, SGS is raised to Vsg, which provides a path for the bit line voltage to dissipate. Between t2 and t3 the sense amplifiers will sense (see step 704) whether the selected memory cells conducted in response to Vcgv applied to WLn. If Vcgv is greater than the threshold voltage of the selected memory cell, then a selected memory cell will conduct current and the bit line voltage will dissipate via the source line, as depicted by curve 1404. If Vcgv is not greater than the threshold voltage of the selected memory cell, then the selected memory cell will not conduct current and the bit line voltage will not dissipate via the source line, as depicted by curve 1402. During the time period of t0-t8 BL(unsel) is at Vss. During the time period of t0-t4, SL is at Vss. SGD(unsel) is at Vss during the entire period depicted in FIG. 14.

During the time period of t4-t8, the system pre-charges the channels of unselected memory cells while lowering voltages at the end of program-verify. At t4, SGD(sel), WL(SB2), WL_D12, WLSB1, WLn, WLunsel(SB0) and WL_D01 are lowered to one or more resting voltages (e.g., Vss, ground, 0 volts). Also at t4, SGS is slowly lowered from Vsg to an intermediate voltage (reaching the intermediate voltage at t6). The intermediate voltage is greater than the threshold voltages of the select gates connected to SGS. The source line SL is raised to VDDSA (a pre-charging voltage of ~2-2.5 v or a different voltage in other embodiments). Maintaining SGS above the intermediate voltage during t4-t5 provide the channels of the unselected NAND strings (i.e., the channels of the unselected memory cells connected to the selected word line and in the selected sub-block) with access to the pre-charging voltage VDDSA on the source line (or another type of control line) so that those channels are pre-charged to the pre-charging voltage VDDSA (or a voltage magnitude slightly less than VDDSA); for example, the channels are pre-charged to ~1.3 volts when VDDSA=2 v. In one embodiment, the pre-charging occurs between t4 and t5. Thus, at t6, SGS is lowered to one or more resting voltages (e.g., Vss, ground, 0 volts). At t7, the source line SL is lowered to Vcsrc (e.g., ~1.5-2.23 v or other voltage). Note that some embodiments may break up the source line to multiple source lines and, therefore, the NAND strings and memory cells would be connected to one or more source lines (one or more other types of control lines). Further note that although example voltage magnitudes are provided herein, the technology described herein is not limited to these voltage magnitudes and other voltage magnitudes can also be used that are suitable for the particular implementation.

At time t8 the system begins the operation of applying a program voltage pulse. The selected bit lines BL(sel) remain at Vss, while unselected bit lines BL(unsel) are raised at t8 to an inhibit voltage Vinhibit (e.g., ~2.5 volts) and SGD(sel) is raised to Vsg. Also at t8, WL(SB2), WL_D12, WLSB1, WL_D01, WLn, and WLunsel(SB0) are all raised to Vpass (e.g., 7-10 volts). At time t9, WLn is raised from Vpass to Vpgm. The signal applied to WLn from t9 to t10 is the voltage program pulse of step 608 of FIG. 6. The applying Vpass to WL(SB2), WL_D12, WLSB1, WL_D01 and WLunsel(SB0) comprises the boosting of step 606 of FIG. 6. Thus, a first subset of NAND strings connected to BL(sel) will be programmed in response to the application of doses of programming (e.g., program voltage pulses) while a second subset of NAND strings connected to BL(unsel) will be inhibited from programming due to the boosting of channels. At time t10, all of the signals that are not already at Vss are lowered to Vss.

Figure 17:
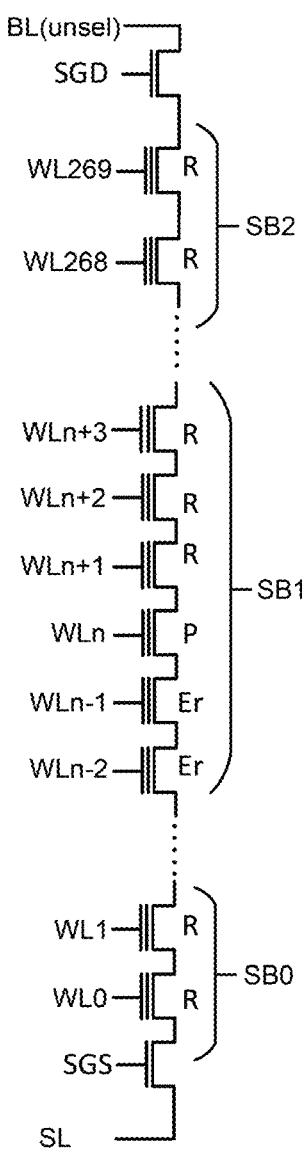
FIG. 17 depicts a NAND string.

FIG. 16 describes one embodiment of programming memory cells in SB1 using the processes of FIGS. 12 and 13. FIG. 17 is an example NAND string of the block that is being operated on according to the process of FIG. 16. As such, WLn is in SB1 and the memory cell connected to WLn is being programmed (as per the P next to the memory cell). The memory cells of SB1 of the depicted NAND string that are on the drain side of WLn have already been programmed. The memory cells of SB1 of the depicted NAND string that are on the source side of WLn have not yet been programmed and, therefore, are in the erased state. In this example, memory cells of SB0 and SB2 have already been programmed.

FIG. 16 depicts the following signals: BL(sel), BL(unsel), SGD(sel), SGD(unsel), WL_Dr, WL_D12, WL_Src, WL_D01, WLn, WL(SB0), SGS and SL. WL_Dr represents all unselected data word lines on the drain side (e.g., bit line side) of WLn. For example, WL_Dr can include all of the data word lines of SB2 and WLn+1-WL179 of SB1. WL_Src are all unselected data word lines of SB1 on the source side of WLn. For example, WL_Src can include WL90-WLn-1. WL(SB0) are all data word lines of SB0.

The time period of t1-t8 of FIG. 16 corresponds to program-verify (see step 610 of FIG. 6) during loop N of the program loops of steps 604-626. The time period of t4-t8 corresponds to the transition to the next program pulse (step 706 of FIG. 7). The time period of t4-t8 also corresponds to channel pre-charge (see step 604 of FIG. 6) during loop N+1 of the program loops of steps 604-626. The time period of t8-t10 corresponds to boosting channels of unselected NAND strings (see step 606 of FIG. 6) and applying a program voltage pulse to the selected data word line and selected memory cells (see step 608 of FIG. 6) during loop N+1 of the program loops of steps 604-626.

At time t0, all signals depicted in FIG. 16 are at Vss (ground or 0 volts). At time t1, BL(sel) is raised to Vb1 (e.g., 0.5-1.5 v), SGD(sel) is raised to Vsg (e.g., 4-6 v), WL_Dr is raised to Vread, WL_D12 is raised to Vread, WL_Src is raised to Vread, WL_D01 is raised to Vread, and WL(SB0) is raised to Vread. Also, at t1, a voltage spike is applied to WLn and subsequent to the voltage on WLn settling down then WLn is raised to Vcgv (which can be any of the verify compare voltages such as, for example, VvA, VvB, VvC, VvD, VvE, VvF, and VvG). At time t2, SGS is raised to Vsg, which provides a path for the bit line voltage to dissipate. Between t2 and t3 the sense amplifiers will sense (see step 704) whether the selected memory cells conducted in response to Vcgv applied to WLn. If Vcgv is greater than the threshold voltage of the selected memory cell, then a selected memory cell will conduct current and the bit line voltage will dissipate via the source line, as depicted by curve 1604. If Vcgv is not greater than the threshold voltage of the selected memory cell, then the selected memory cell will not conduct current and the bit line voltage will not dissipate via the source line, as depicted by curve 1602. During the time period of t0-t8 BL(unsel) is at Vss. During the time period of t0-t4, SL is at Vss. SGD(unsel) is at Vss during the entire period depicted in FIG. 16.

During the time period of t4-t8, the system pre-charges the channels of unselected memory cells while lowering voltages at the end of program-verify. Thus, the time period of t4-t8 provides an example implementation of steps 1202-1204 of FIG. 12 and of steps of 1320-1332 FIG. 13. At t4, SGD(sel), WL_Dr, WL_D12, WL_Src, and WLn are lowered to one or more resting voltages (e.g., Vss, ground, 0 volts). Also at t4, SGS is slowly lowered from Vsg to the intermediate voltage (reaching the intermediate voltage at t7). The source line SL is raised to VDDSA at t4. Maintaining WL_D01 at Vread and SGS above the intermediate voltage during t4-t5 provide the channels of the unselected NAND strings (i.e., the channels of the unselected memory cells connected to the selected word line and in the selected sub-block) with access to the pre-charging voltage VDDSA on the source line (or another type of control line) so that those channels are pre-charged to the pre-charging voltage VDDSA (or a voltage magnitude slightly less than VDDSA); for example, the channels are pre-charged to ~1.3 volts when VDDSA=2 v. In one embodiment, the pre-charging occurs between t4 and t5. At t5 WL_D01 is lowered to one or more resting voltages (e.g., Vss, ground, 0 volts). While lowering WL_D01, as soon as the voltage magnitude of WL_D01 is below the threshold voltages of the dummy memory cells connected to WL_D01, the channels of the unselected NAND strings (i.e. the channels of the unselected memory cells connected to the selected word line WLn and in the selected sub-block) are cut off from the source line SL (or other one or more control lines) subsequent to the pre-charging and prior to lowering WL(SB0). Subsequent to cutting off the channels of the unselected NAND strings from the source line, at t6 WL(SB0) is lowered from Vread to one or more resting voltages (e.g., Vss, ground, 0 volts). At t7, SGS is lowered from the intermediate voltage to Vss. At t8, the source line SL is lowered to Vcsrc (e.g., ~1.5-2.23 v or other voltage).

At time t8 the system begins the operation of applying a program voltage pulse. The selected bit lines BL(sel) remain at Vss, while unselected bit lines BL(unsel) are raised at t8 to an inhibit voltage Vinhibit (e.g., ~2.5 volts) and SGD(sel) is raised to Vsg. Also at t8, WL_Dr, WL_D12, WL_Src, WL_D01, WLn, and WL(SB0) are all raised to Vpass. At time t9, WLn is raised from Vpass to Vpgm. The signal applied to WLn from t9 to t10 is the voltage program pulse of step 608 of FIG. 6. The applying Vpass to WL_Dr, WL_D12, WL_Src, WL_D01, WLn, and WL(SB0) comprises the boosting of step 606 of FIG. 6. Thus, a first subset of NAND strings connected to BL(sel) will be programmed in response to the application of doses of programming (e.g., program voltage pulses) while a second subset of NAND strings connected to BL(unsel) will be inhibited from programming due to the boosting of channels. At time t10, all of the signals that are not already at Vss are lowered to Vss.

FIG. 18 depicts the following signals: BL(sel), BL(unsel), SGD(sel), SGD(unsel), WL_DD, WL_SS, WL_D12, WL_D01, WLn, WL(SB0&SB1), SGS and SL. WL_DS are all unselected data word lines of SB2 on the drain side (e.g., bit line side) of WLn. For example, WL_DS can include WLn+1-WL269 of SB2. WL_SS are all unselected data word lines of SB2 on the source side of WLn. For example, WL_SS can include WL180-WLn−1. WL(SB0&SB1) are all data word lines of SB0 and SB1.

Figure 19:
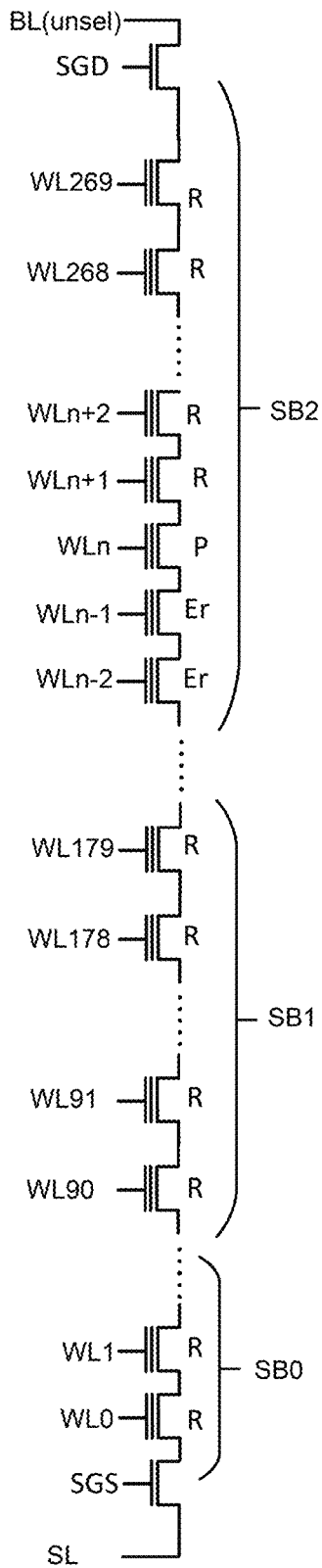
FIG. 19 depicts a NAND string.

FIG. 18 describes one embodiment of programming memory cells in SB2 using the processes of FIGS. 12 and 13. FIG. 19 is an example NAND string of the block that is being operated on according to the process of FIG. 18. As such, WLn is in SB2 and the memory cell connected to WLn is being programmed (as per the P next to the memory cell). The memory cells of SB2 of the depicted NAND string that are on the drain side of WLn have already been programmed. The memory cells of SB2 of the depicted NAND string that are on the source side of WLn have not yet been programmed and, therefore, are in the erased state. In this example, memory cells of SB0 and SB1 have already been programmed. Note that in FIGS. 14-19, all sub-blocks are programmed in an order from the drain side to the source side.

The time period of t1-t8 of FIG. 18 corresponds to program-verify (see step 610 of FIG. 6) during loop N of the program loops of steps 604-626. The time period of t4-t8 corresponds to the transition to the next program pulse (step 706 of FIG. 7). The time period of t4-t8 also corresponds to channel pre-charge (see step 604 of FIG. 6) during loop N+1 of the program loops of steps 604-626. The time period of t8-t10 corresponds to boosting channels of unselected NAND strings (see step 606 of FIG. 6) and applying a program voltage pulse to the selected data word line and selected memory cells (see step 608 of FIG. 6) during loop N+1 of the program loops of steps 604-626.

At time to, all signals depicted in FIG. 18 are at Vss (ground or 0 volts). At time t1, BL(sel) is raised to Vb1 (e.g., 0.5-1.5 v), SGD(sel) is raised to Vsg (e.g., 4-6 v), WL_DS is raised to Vread, WL_SS is raised to Vread, WL_D12 is raised to Vread, WL_D01 is raised to Vread, and WL(SB0&SB1) is raised to Vread. Also, at t1, a voltage spike is applied to WLn and subsequent to the voltage on WLn settling down then WLn is raised to Vcgv (which can be any of the verify compare voltages such as, for example, VvA, VvB, VvC, VvD, VvE, VvF, and VvG). At time t2, SGS is raised to Vsg, which provides a path for the bit line voltage to dissipate. Between t2 and t3 the sense amplifiers will sense (see step 704) whether the selected memory cells conducted in response to Vcgv applied to WLn. If Vcgv is greater than the threshold voltage of the selected memory cell, then a selected memory cell will conduct current and the bit line voltage will dissipate via the source line, as depicted by curve 1804. If Vcgv is not greater than the threshold voltage of the selected memory cell, then the selected memory cell will not conduct current and the bit line voltage will not dissipate via the source line, as depicted by curve 1802. During the time period of t0-t8 BL(unsel) is at Vss. During the time period of t0-t4, SL is at Vss. SGD(unsel) is at Vss during the entire period depicted in FIG. 18.

During the time period of t4-t8, the system pre-charges the channels of unselected memory cells while lowering voltages at the end of program-verify. Thus, the time period of t4-t8 provides an example implementation of steps 1202-1204 of FIG. 12 and of steps of 1320-1332 FIG. 13. At t4, SGD(sel), WL_DS, WL_SS, and WLn are lowered to one or more resting voltages (e.g., Vss, ground, 0 volts). Also at t4, SGS is slowly lowered from Vsg to the intermediate voltage (reaching the intermediate voltage at t7). The source line SL is raised to VDDSA at t4. Maintaining WL_D12, WL_D01 and WL(SB0&SB1) at Vread and SGS above the intermediate voltage during t4-t5 provide the channels of the unselected NAND strings (i.e., the channels of the unselected memory cells connected to the selected word line and in the selected sub-block) with access to the pre-charging voltage VDDSA on the source line (or another type of control line) so that those channels are pre-charged to the pre-charging voltage VDDSA (or a voltage magnitude slightly less than VDDSA); for example, the channels are pre-charged to ~1.3 volts when VDDSA=2 v. In one embodiment, the pre-charging occurs between t4 and t5. Thus, at t5, WL_D12 is lowered to one or more resting voltages (e.g., Vss, ground, 0 volts). While lowering WL_D12, as soon as the voltage magnitude of WL_D12 is below the threshold voltages of the dummy memory cells connected to WL_D12, the channels of the unselected NAND strings (i.e. the channels of the unselected memory cells connected to the selected word line WLn and in the selected sub-block) are cut off from the source line SL (or other one or more control lines) subsequent to the pre-charging and prior to lowering WL(SB0&SB1). Subsequent to cutting off the channels of the unselected NAND strings from the source line, at t6 WL(SB0&SB1) and WL_D01 are lowered from Vread to one or more resting voltages (e.g., Vss, ground, 0 volts). At t7, SGS is lowered from the intermediate voltage to Vss. At t8, the source line SL is lowered to Vcsrc (e.g., ~1.5-2.23 v or other voltage).

At time t8 the system begins the operation of applying a program voltage pulse. The selected bit lines BL(sel) remain at Vss, while unselected bit lines BL(unsel) are raised at t8 to an inhibit voltage Vinhibit and SGD(sel) is raised to Vsg. Also at t8 WL_DD, WL_SS, WL_D12, WL_D01, WLn, and WL(SB0&SB1) are all raised to Vpass. At time t9, WLn is raised from Vpass to Vpgm. The signal applied to WLn from t9 to t10 is the voltage program pulse of step 608 of FIG. 6. The applying Vpass to WL_DD, WL_SS, WL_D12, WL_D01, WLn, and WL(SB0&SB1) comprises the boosting of step 606 of FIG. 6. Thus, a first subset of NAND strings connected to BL(sel) will be programmed in response to the application of doses of programming (e.g., program voltage pulses) while a second subset of NAND strings connected to BL(unsel) will be inhibited from programming due to the boosting of channels. At time t10, all of the signals that are not already at Vss are lowered to Vss.

A memory system has been disclosed that provides the flexibility to independently program sub-blocks and saves time during programming by pre-charging the channels of unselected memory cells while lowering voltages at the end of program-verify.

One embodiment includes a non-volatile storage apparatus, comprising: data word lines; one or more control lines; a plurality of non-volatile memory cells connected to the data word lines and the one or more control lines; and a control circuit connected to the data word lines and the one or more control lines as well as the memory cells. The control circuit is configured to pre-charge channels of unselected memory cells while lowering voltages at the end of program-verify by applying an overdrive voltage to data word lines between a selected word line and the one or more control lines concurrently with applying a pre-charging voltage to the one or more control lines to provide the channels of the unselected memory cells with access to the pre-charging voltage on the one or more control lines while lowering voltages of data word lines further from the one or more control lines than the selected word line. The control circuit is configured to cut off the channels of the unselected memory cells from the one or more control lines subsequent to the pre-charging and prior to lowering the data word lines between the selected word line and the one or more control lines from the overdrive voltage to one or more voltages below threshold voltages of memory cells connected to the data word lines between the selected word line and the one or more control lines.

One embodiment includes a method of operating non-volatile storage, comprising: applying doses of programming to a selected data word line of a plurality of data word lines connected to multiple NAND strings that form a block having at least three sub-blocks, each NAND string includes memory cells in each of the three sub-blocks, the selected word line is in a selected sub-block, each NAND string includes a dummy memory cell; inhibiting unselected NAND strings from programming by boosting channels of the unselected NAND strings in the selected sub-block from a positive pre-charge voltage to a boosted voltage; performing program-verify between pairs of successive doses of programming; pre-charging channels of the unselected NAND strings in the selected sub-block to the positive pre-charge voltage while lowering voltages at the end of program-verify by concurrently: applying a pre-charging voltage to a source line connected to the NAND strings, applying overdrive voltages to data word lines in a sub-block closer to the source line than the selected sub-block, lowering voltages of data word lines on a side the selected word line that is further from the source line than the selected data word line, and applying an overdrive voltage to a dummy word line between the selected sub-block and the sub-block closer to the source line than the selected sub-block, the dummy word line is connected to the dummy memory cells of the NAND strings; after the pre-charging, lowering to a resting voltage the dummy word line between the selected sub-block and the sub-block closer to the source line; and after the lowering the dummy word line to the resting voltage and prior to a next dose of programming, lowering to one or more resting voltages the data word lines in the sub-block closer to the source line than the selected sub-block.

One embodiment includes a non-volatile storage apparatus, comprising: a plurality of non-volatile memory cells arranged as NAND strings to form a block having at least three sub-blocks, each NAND string includes memory cells in each of the three sub-blocks, each NAND string includes a dummy memory cell; a plurality of data word lines connected to the NAND strings; a dummy word line connected to the dummy memory cells of the NAND strings; a plurality of bit lines connected to the NAND strings; a source line connected to the NAND strings; and a control circuit connected to the data word lines, dummy word line, bit lines and source line. The control circuit is configured to program memory cells connected to a selected data word line by applying a series of program voltage pulses to the selected data word line and boosting channels of unselected NAND strings. The control circuit is configured to perform program-verify between the program voltage pulses. The control circuit includes a means for pre-charging channels of unselected NAND strings in a selected sub-block prior to a next program voltage pulse from a source line while lowering voltages at the end of program-verify by applying overdrive voltages to data word lines in a sub-block closer to the source line than the selected sub-block and lowering to a resting voltage a dummy word line between the selected sub-block and the sub-block closer to the source line prior to lowering to the resting voltage the data word lines in the sub-block closer to the source line.

Examples of the means for pre-charging channels of unselected NAND strings in a selected sub-block include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits (including hardware only or a combination of hardware and software/firmware) performing the processes of FIG. 12, 13, 16 or 18.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   data word lines;
   one or more control lines;
   a plurality of non-volatile memory cells connected to the data word lines and the one or more control lines; and
   a control circuit connected to the data word lines and the one or more control lines as well as the memory cells, the control circuit is configured to pre-charge channels of unselected memory cells while lowering voltages at the end of program-verify by applying an overdrive voltage to data word lines between a selected word line and the one or more control lines concurrently with applying a pre-charging voltage to the one or more control lines to provide the channels of the unselected memory cells with access to the pre-charging voltage on the one or more control lines while lowering voltages of data word lines further from the one or more control lines than the selected word line, the control circuit is configured to cut off the channels of the unselected memory cells from the one or more control lines subsequent to the pre-charging and prior to lowering the data word lines between the selected word line and the one or more control lines from the overdrive voltage to one or more voltages below threshold voltages of memory cells connected to the data word lines between the selected word line and the one or more control lines.

2. The non-volatile storage apparatus of claim 1, wherein:
   the one or more control lines are one or more source lines; and
   the control circuit is configured to lower the one or more source lines from the pre-charging voltage to a resting voltage for the one or more source lines after cutting off the channels of the unselected memory cells from the one or more source lines.

3. The non-volatile storage apparatus of claim 1, further comprising:
   dummy memory cells; and
   a dummy word line connected to the dummy memory cells, the dummy word line is positioned between the selected word line and the one or more control lines, the control circuit is configured to apply a first voltage to the dummy word line when pre-charging channels of unselected memory cells at the end of program-verify, the first voltage is greater than threshold voltages of the dummy memory cells, the control circuit is configured to cut off the channels of the unselected memory cells from the one or more control lines by lowering the dummy word line from the first voltage to a voltage that is lower than threshold voltages of the dummy memory cells.

4. The non-volatile storage apparatus of claim 1, wherein:
   the control circuit is configured to program memory cells connected to the selected data word line by applying doses of programming to the selected data word line and boosting channels of unselected memory cells after the pre-charging, the control circuit is configured to perform program-verify between the program voltage pulses.

5. The non-volatile storage apparatus of claim 1, wherein:
   the non-volatile memory cells form a block having at least three sub-blocks;
   the selected word line is in a selected sub-block; and
   the data word lines between the selected word line and the one or more control lines are in an unselected sub-block that is between the selected word line and the one or more control lines.

6. The non-volatile storage apparatus of claim 5, further comprising:
   dummy memory cells; and
   a dummy word line connected to the dummy memory cells, the dummy word line is positioned between the selected sub-block and the unselected sub-block that is between the selected word line and the one or more control lines, the control circuit is configured to apply a first voltage to the dummy word line when pre-charging channels of unselected memory cells at the end of program-verify, the first voltage is greater than threshold voltages of the dummy memory cells, the control circuit is configured to cut off the channels of the unselected memory cells from the one or more control lines by lowering the dummy word line from the first voltage to a voltage that is lower than threshold voltages of the dummy memory cells.

7. The non-volatile storage apparatus of claim 5, wherein:
   the control circuit is configured to lower the selected word line from a verify compare voltage to a resting voltage for the selected word line at the end of program-verify concurrently with lowering voltages of data word lines further from the one or more control lines than the selected word line.

8. The non-volatile storage apparatus of claim 5, wherein:
   the control circuit is configured to lower voltages of data word lines in the selected sub-block on a side the selected word line that is closer to the one or more control lines concurrently with the lowering voltages of data word lines further from the one or more control lines than the selected word line.

9. The non-volatile storage apparatus of claim 1, wherein:
the memory cells are arranged as NAND strings to form a block having at least three sub-blocks, each NAND string includes memory cells in each of the three sub-blocks;
the selected word line is in a selected sub-block; and
the data word lines between the selected word line and the one or more control lines are in an unselected sub-block that is between the selected word line and the one or more control lines.

10. The non-volatile storage apparatus of claim 9, further comprising:
dummy memory cells, each NAND string includes at least one dummy memory cell; and
a dummy word line connected to the dummy memory cells, the dummy word line is positioned between the selected sub-block and the unselected sub-block, the control circuit is configured to apply a first voltage to the dummy word line when pre-charging channels of unselected memory cells at the end of program-verify, the first voltage is greater than threshold voltages of the dummy memory cells, the control circuit is configured to cut off the channels of the unselected memory cells from the one or more control lines by lowering the dummy word line from the first voltage to a voltage that is lower than threshold voltages of the dummy memory cells.

11. The non-volatile storage apparatus of claim 10, wherein:
the control circuit is configured to lower the selected word line from a verify compare voltage to a resting voltage for the selected word line at the end of program-verify concurrently with lowering voltages of data word lines further from the one or more control lines than the selected word line; and
the control circuit is configured to lower voltages of data word lines in the selected sub-block on a side the selected word line that is closer to the one or more control lines concurrently with the lowering voltages of data word lines further from the one or more control lines than the selected word line.

12. The non-volatile storage apparatus of claim 10, wherein:
the control circuit is configured to program memory cells connected to the selected data word line by applying doses of programming to the selected data word line and boosting channels of unselected NAND after the pre-charging, the control circuit is configured to perform the program-verify between the program voltage pulses.

13. A method of operating non-volatile storage, comprising:
applying doses of programming to a selected data word line of a plurality of data word lines connected to multiple NAND strings that form a block having at least three sub-blocks, each NAND string includes memory cells in each of the three sub-blocks, the selected word line is in a selected sub-block, each NAND string includes a dummy memory cell;
inhibiting unselected NAND strings from programming by boosting channels of unselected NAND strings in the selected sub-block from a positive pre-charge voltage to a boosted voltage;
performing program-verify between pairs of successive doses of programming;
pre-charging channels of the unselected NAND strings in the selected sub-block to the positive pre-charge voltage while lowering voltages at the end of program-verify by concurrently:
applying a pre-charging voltage to a source line connected to the NAND strings,
applying overdrive voltages to data word lines in a sub-block closer to the source line than the selected sub-block,
lowering voltages of data word lines on a side the selected word line that is further from the source line than the selected data word line, and
applying an overdrive voltage to a dummy word line between the selected sub-block and the sub-block closer to the source line than the selected sub-block, the dummy word line is connected to the dummy memory cells of the NAND strings;
after the pre-charging, lowering to a resting voltage the dummy word line between the selected sub-block and the sub-block closer to the source line; and
after the lowering the dummy word line to the resting voltage and prior to a next dose of programming, lowering to one or more resting voltages the data word lines in the sub-block closer to the source line than the selected sub-block.

14. The method of claim 13, further comprising:
lowering the selected word line from a verify compare voltage to a resting voltage for the selected word line at the end of program-verify concurrently with the lowering voltages of data word lines on the side the selected word line that is further from the source line than the selected data word line.

15. The method of claim 13, further comprising:
lowering a source side select line from a verify enable voltage to an intermediate voltage after starting to apply the overdrive voltages, each NAND string includes a source side select gate between memory cells and the source line, the source side select line is connected to the source side select gates, the intermediate voltage is higher in magnitude than threshold voltages of the source side select gates.

16. The method of claim 13, further comprising:
at the end of program-verify, lowering voltages of data word lines in the selected sub-block on a side the selected word line that is closer to the source line than the selected data word line concurrently with the lowering voltages of data word lines on the side the selected word line that is further from the source line than the selected data word line.

17. The method of claim 13, further comprising:
after the lowering the dummy word line to the resting voltage and prior to a next dose of programming, lowering the source line from the pre-charging voltage to a lower voltage.

18. The method of claim 13, wherein:
the lowering the dummy word line to the resting voltage comprises lowering the dummy word line from a voltage greater than threshold voltages of the dummy memory cells to a voltage less than the threshold voltages of the dummy memory cells.

19. The method of claim 13, wherein:
the lowering voltages of data word lines on the side the selected word line that is further from the source line than the selected data word line comprises lowering the data word lines on the side of the selected word line that is further from the source line than the selected data word line from one or more overdrive voltages to one or more resting voltages.

20. A non-volatile storage apparatus, comprising:
a plurality of non-volatile memory cells arranged as NAND strings to form a block having at least three sub-blocks, each NAND string includes memory cells in each of the three sub-blocks, each NAND string includes a dummy memory cell;
a plurality of data word lines connected to the NAND strings;
a dummy word line connected to the dummy memory cells of the NAND strings;
a plurality of bit lines connected to the NAND strings;
a source line connected to the NAND strings; and
a control circuit connected to the data word lines, dummy word line, bit lines and source line;
the control circuit is configured to program memory cells connected to a selected data word line by applying a series of program voltage pulses to the selected data word line and boosting channels of unselected NAND strings, the control circuit is configured to perform program-verify between the program voltage pulses, the control circuit includes a means for pre-charging channels of unselected NAND strings in a selected sub-block prior to a next program voltage pulse from a source line while lowering voltages at the end of program-verify by applying overdrive voltages to data word lines in a sub-block closer to the source line than the selected sub-block and lowering to a resting voltage a dummy word line between the selected sub-block and the sub-block closer to the source line prior to lowering to the resting voltage the data word lines in the sub-block closer to the source line.

* * * * *